(12) United States Patent
Choi

(10) Patent No.: US 12,130,316 B2
(45) Date of Patent: Oct. 29, 2024

(54) BROADBAND LOSSLESS PARTIAL DISCHARGE DETECTION AND NOISE REMOVAL DEVICE

(71) Applicant: ECOTOMORROW KOREA CO., LTD., Daegu (KR)

(72) Inventor: Kwang Sik Choi, Daegu (KR)

(73) Assignee: ECOTOMORROW KOREA CO., LTD., Daegu (KR)

(*) Notice: Subject to any disclaimer, the term of this patent is extended or adjusted under 35 U.S.C. 154(b) by 8 days.

(21) Appl. No.: 18/016,159

(22) PCT Filed: Jul. 15, 2020

(86) PCT No.: PCT/KR2020/009311
§ 371 (c)(1),
(2) Date: Jan. 13, 2023

(87) PCT Pub. No.: WO2022/014741
PCT Pub. Date: Jan. 20, 2022

(65) Prior Publication Data
US 2023/0314496 A1   Oct. 5, 2023

(51) Int. Cl.
*G01R 29/027* (2006.01)
*G01R 23/165* (2006.01)
(Continued)

(52) U.S. Cl.
CPC ......... *G01R 29/027* (2013.01); *G01R 23/165* (2013.01); *G01R 29/26* (2013.01); *G01R 31/14* (2013.01)

(58) Field of Classification Search
None
See application file for complete search history.

(56) References Cited

U.S. PATENT DOCUMENTS 9,838,228 B2 * 12/2017 Choi .................. G01N 29/2418
2021/0190839 A1 * 6/2021 Lim ..................... G01R 23/165

FOREIGN PATENT DOCUMENTS

JP    2003-152570 A    5/2003
KR   20-0435061 Y1    1/2007
(Continued)

OTHER PUBLICATIONS

International Search Report for PCT/KR2020/009311 mailed Apr. 14, 2021 from Korean Intellectual Property Office.

*Primary Examiner* — Jeffrey S Zweizig
(74) *Attorney, Agent, or Firm* — Paratus Law Group, PLLC

(57) ABSTRACT

There is provided a broadband lossless partial discharge detection and noise removal device which includes: a partial discharge occurrence timing pulse acquiring unit acquiring a generated timing pulse of a partial discharge signal at the beginning of generation of a partial discharge signal; a partial discharge magnitude pulse acquiring unit acquiring a magnitude pulse of the partial discharge signal; a synchronization comparing unit detecting a partial discharge digital signal determined according to whether the generated timing pulse of the partial discharge signal and the magnitude pulse are synchronized; and a partial discharge signal generating unit detecting a partial discharge pulse obtained by converting the detected partial discharge digital signal into an analog signal.

26 Claims, 21 Drawing Sheets

(51) Int. Cl.
  *G01R 29/26* (2006.01)
  *G01R 31/14* (2006.01)

(56) References Cited

FOREIGN PATENT DOCUMENTS

| KR | 10-2010-0007445 A | 1/2010 |
| KR | 10-2013-0034398 A | 4/2013 |
| KR | 10-2014-0067653 A | 6/2014 |
| KR | 10-1496442 B1 | 2/2015 |
| KR | 10-2017-0134573 A | 12/2017 |
| KR | 10-2153448 B1 | 9/2020 |

\* cited by examiner

Slope = (VO2 - VO1) / (PI2 - PI1)

(a)

(b)

400

[CHANNEL A]　　　　[CHANNEL B]

BROADBAND LOSSLESS PARTIAL DISCHARGE DETECTION AND NOISE REMOVAL DEVICE

CROSS-REFERENCE TO PRIOR APPLICATION

This application is a National Stage Patent Application of PCT International Patent Application No. PCT/KR2020/009311 (filed on Jul. 15, 2020) under 35 U.S.C. § 371, which is hereby incorporated by reference in its entirety.

BACKGROUND

The present disclosure relates to a broadband lossless partial discharge detection and noise removal technology, and more particularly, to a broadband lossless partial discharge detection and noise removal device which detects a pulse in which a partial discharge occurrence timing pulse T-pulse and a partial discharge magnitude pulse Q-pulse are time-synchronized with each other as a partial discharge signal by applying a pulse synchronization technique to detect a band partial discharge signal losslessly and removes a pulse in which the two pulses are not time-synchronized with each other as noise, thereby effectively detecting the partial discharge signal in broadband losslessly in an input signal in which the partial discharge signal and noise are mixed together.

Partial discharge diagnosis technology is used for preventive diagnosis of electric equipment in the fields of power facilities and electric vehicles. In general, partial discharge diagnosis technology corresponds to a non-destructive diagnosis technology that detects electromagnetic waves, ultrasonic waves, light, or vibration generated inside electric equipment and diagnoses whether partial discharge occurs in advance.

Partial discharge diagnosis technology of the related art using electromagnetic waves is applied to power cable partial discharge diagnosis using HFCT, power facility partial discharge diagnosis using a UHF sensor, electric vehicle partial discharge diagnosis using an HFCT and UHF hybrid sensor, and the like.

The method of detecting the occurrence of partial discharge using electromagnetic waves includes a large amount of other noise in the process of detecting partial discharge, and it is difficult to accurately distinguish between a partial discharge signal generated due to partial discharge and partial discharge partial discharge-like noise or communication noise, so the reliability of partial discharge diagnosis is significantly lowered.

The partial discharge signal generally includes some or all of the 500 MHz to 5 GHz frequency bands, a rising time generally includes some or all of the 0.2 nS to 2.0 nS bands, and a pulse width includes some or all of the 1 nS to 3 nS bands. The frequency band overlaps a communication service (noise) band, and some communication services (noise) have the rising time band and the pulse width band, causing serious obstacles to partial discharge detection. To handle this, a filter (band rejection) is used in the field, but noise is not completely removed due to the use of the filter, and thus, double and triple filters are used, which, however, results in a side effect of attenuation for the partial discharge signal to become problematic. In addition, there was no countermeasure against noise, such as air corona, which is a noise very similar to the partial discharge signal, so the field workers were deeply troubled or there was no alternative.

The partial discharge signal input through a sensor shows a burst of high-frequency pulses with a pulse width of several nS and does not have a standard pattern. Partial discharge noise clusters (bursts) or communication noise clusters similar to partial discharge signals have portions in the clusters where component pulses constituting the clusters are different from the pulses constituting the partial discharge signal clusters. However, especially, in the field of cable partial discharge, it is not easy to detect cable partial discharge because the noise is very similar to partial discharge and has a relatively large signal strength.

Conventional partial discharge noise removal technologies include filtering technology, noise gating technology, and speed difference noise removal technology. The filtering technology, in particular, band rejection filtering technology, has limitations in noise removal in terms of broadband partial discharge characteristics, the noise gating technology is not practical because noise and partial discharge are not distinguished from each other, and the speed difference noise removal technology has an error of recognizing very high speed noise among noise as partial discharge, so it was not effective in removing partial discharge noise.

Partial discharge prevention diagnosis is an essential part for life safety and facility maintenance. The biggest challenge in the field of partial discharge prevention and diagnosis in electric power fields is noise removal, and in particular, removal of partial discharge noise, such as corona noise, is a challenge.

The partial discharge prevention diagnosis method using electromagnetic waves exhibits the best results and thus is preferred. However, as new communication services continuously appear, the method of attaching a filter cannot remove noise and there has been an attempt to distinguish between noise and partial discharge through high speed operation, but when applied in the field, noise is not properly filtered, the detected partial discharge signal has a loss due to the filter attachment, a partial discharge generating band cannot cover the entire band, it is bulky and not economical, so that an application field is limited. Therefore, the noise removal using the conventional filter attachment and high-speed software processing method has limitations, so a method for economically and effectively removing noise without using a filter and high-speed software is required. The partial discharge signal shows a burst form of high-frequency pulses with a pulse width of several nS, and is different from partial discharge noise similar to other partial discharge signals or communication noise, but, in particular, in the cable partial discharge field, it is not easy to distinguish between a partial discharge signal from the partial discharge noise.

Korean Patent Registration No. 10-1496442 (Feb. 2, 2017) relates to a device for diagnosing partial discharge on a cable. Since the technology applies a narrow band-pass filter to remove noise, the partial discharge signal is filtered, having disadvantages in that partial discharge is not properly detected. Moreover, despite the application of a band-pass filter, a "partial discharge signal detector that distinguishes between noise and PD" proves that noise is introduced. The above technology has a disadvantage in that economic feasibility is low because an additional high-speed ADC and a software computing process are required to distinguish between noise and a partial discharge signal.

Korean Patent Registration No. 20-0435061 (Dec. 29, 2006) relates to a partial discharge counter for diagnosing a gas insulated switchgear, which also has disadvantageous in that a partial discharge signal is filtered because the technology also applies a band-pass filter to remove noise from an input signal, so that partial discharge cannot be properly detected. Since a peak detection circuit is applied, if noise larger than the partial discharge signal is introduced within a band of the band-pass filter, a noise signal may be recognized as a partial discharge and counted.

SUMMARY

The present disclosure has been devised to solve the above problems.

An embodiment of the present disclosure is to provide a broadband lossless partial discharge detection and noise removal device as a three-dimensional (3D) technological concept, such as partial discharge occurrence timing, partial discharge signal magnitude, and synchronization analysis, beyond the conventional one-dimensional technology concept based on a simple frequency in partial discharge acquisition and noise removal.

An embodiment of the present disclosure is to provide a broadband lossless partial discharge detection and noise removal device capable of effectively detecting whether a partial discharge signal is included in an input signal.

More specifically, an embodiment of the present disclosure provides a broadband lossless partial discharge detection and noise removal device capable of effectively suppressing noise and detecting only partial discharge of a lossless broadband by removing a signal irrelevant to synchronization as noise by comparing synchronizations between a partial discharge occurrence timing pulse T-pulse and a partial discharge magnitude pulse Q-pulse.

In addition, an embodiment of the present disclosure is to provide a broadband lossless partial discharge detection and noise removal device capable of controlling characteristics that are not recognized as partial discharge according to attenuation based on a distance, so that partial discharge noise, such as air corona may be removed, and capable of controlling a partial discharge detection distance, so that an operation may be performed for each target device.

An embodiment of the present disclosure has a T/Q pulse type noise removal circuit configuration that applies PANA (Partial Discharge Amplification Noise Attenuation) technology (Korean Patent Application No. 10-2017-0134573) one step further, in which, by detecting a partial discharge signal from an input signal mixed with noise, a filter attachment is not required and a high-speed operation process is not required, and thus, it is economical and has a small volume so as to be used in various fields.

An embodiment of the present disclosure is to provide a broadband lossless partial discharge detection and noise removal device including an front stage signal divider, in which one output terminal of the front stage signal splitter is input to a partial discharge occurrence timing pulse acquiring unit, obtains a timing pulse, and inputs the acquired timing pulse to one end of a synchronization comparison device, another output terminal of the front stage signal splitter is input to a partial discharge magnitude pulse acquiring unit, obtains a magnitude pulse, and inputs the acquired magnitude pulse to the other end of a synchronization comparison device, detects a portion in which two signals are simultaneously present in a time domain to acquire only a purely partial discharge signal, thereby reproducing a partial discharge signal without noise, and the broadband lossless partial discharge detection and noise removal device is applied to various devices.

In embodiments, a broadband lossless partial discharge detection and noise removal device includes: a partial discharge occurrence timing pulse acquiring unit acquiring a generated timing pulse of a partial discharge signal at the beginning of generation of a partial discharge signal; a partial discharge magnitude pulse acquiring unit acquiring a magnitude pulse of the partial discharge signal; a synchronization comparing unit detecting a partial discharge digital signal determined according to whether the generated timing pulse of the partial discharge signal and the magnitude pulse are synchronized; and a partial discharge signal generating unit detecting a partial discharge pulse obtained by converting the detected partial discharge digital signal into an analog signal, wherein the synchronization comparing unit detects the corresponding pulse as the partial discharge pulse when the timing pulse and the magnitude pulse of the partial discharge signal are synchronized in the time domain, and determines and removes the corresponding pulse as noise when the timing pulse and the magnitude pulse are not synchronized.

The partial discharge signal generating unit may regenerate or generate a partial discharge signal through the detected partial discharge pulse.

The partial discharge occurrence timing pulse acquiring unit may include: a first proportional signal generating unit generating first and second proportional signals according to an input signal; a first AGC performing automatic gain control on a partial discharge detection signal generated based on the first proportional signal and fed back to an input terminal through at least one partial discharge capacitor; a second AGC performing automatic gain control based on a partial discharge comparison signal generated based on the second proportional signal and fed back to the input terminal; a timing noise removal unit generating a timing noise removal signal from which timing noise is removed based on the partial discharge detection signal and the partial discharge comparison signal; and a timing pulse generating unit acquiring a partial discharge occurrence timing pulse.

The partial discharge magnitude pulse acquiring unit may include: a second proportional signal generating unit generating third and fourth proportional signals according to an input signal; a third AGC performing automatic gain control on a partial discharge detection signal generated based on the third proportional signal and fed back to the input terminal through at least one partial discharge capacitor; a fourth AGC performing automatic gain control based on a partial discharge comparison signal generated based on the fourth proportional signal and fed back to the input terminal; a magnitude noise removal unit generating a magnitude noise removal signal from which magnitude noise is removed based on the partial discharge detection signal and the partial discharge comparison signal; and a magnitude pulse generating unit acquiring a partial discharge magnitude pulse.

The first AGC may feed back intensity of an amplitude or frequency of the partial discharge detection signal to the input terminal through the at least one partial discharge capacitor, and when the partial discharge signal is reflected in the partial discharge detection signal, the first AGC may induce a temporary over-amplification in the process of the automatic gain control.

The first AGC may filter a specific frequency band from the partial discharge detection signal through at least one partial discharge capacitor having one end connected to an output terminal and the other end connected to a ground, and feed back to the corresponding automatic gain control process.

The third AGC may include a partial discharge loop filter module performing adjustment of a frequency band width of the partial discharge detection signal input to the input terminal through the at least one partial discharge capacitor and at least one partial discharge resistor connected to one end of the at least one partial discharge capacitor.

The first AGC may perform the frequency bandwidth adjustment through a low pass filter (LPF) or a high pass filter (HPF) implemented through a combination of at least two of a capacitor, an inductor, a resistor, and an amplifier.

The timing noise removal unit and the magnitude noise removal unit may each remove a component other than the partial discharge as the timing noise and the magnitude noise by eliminating a difference portion between the partial discharge detection signal and the partial discharge comparison signal or summing similar portions.

The timing noise removal unit and the magnitude noise removal unit may be implemented through a difference amplifier calculating a difference between the partial discharge detection signal and the partial discharge comparison signal or a differential amplifier differentially amplifying between the partial discharge detection signal and the partial discharge comparison signal.

The timing pulse generating unit may generate a partial discharge occurrence timing pulse by modifying the partial discharge signal acquired from the difference amplifier or the differential amplifier into a transistor logic (TTL) pulse.

Each of the first proportional signal generating unit and the second proportional signal generating unit may be implemented through at least one of a log detector demodulating a log value of the input signal, an amplifier, an envelope detector, and an integrator or through a combination of at least two thereof.

Each of the timing noise removal unit and the magnitude noise removal unit may further include a noise removal module removing a signal output with an intensity smaller than a specific reference voltage, among output signals, to further remove the timing noise and the magnitude noise.

Each of the timing noise removal unit and the magnitude noise removal unit may determine the specific reference voltage through manual setting by a user or automatic setting through internal or remote feedback.

Each of the timing noise removal unit and the magnitude noise removal unit may perform the manual setting based on a local analog voltage according to a variable resistance manually varied by a user locally, a remote analog voltage provided remotely, or a digital-to-analog converter (DAC) output based on remotely provided remote digital data transmission.

The timing noise removal unit may include (a) a low-pass filter disposed at an output terminal and filtering the timing noise removal signal and (b) a feedback module detecting a lowest value, an average value, or a highest value of the filtered timing noise removal signal through analog-to-digital conversion and digital operation and automatically setting the specific reference voltage by feeding back until a corresponding detection value converges within a specific reference range.

In embodiments, the broadband lossless partial discharge detection and noise removal device may further include: a controller controlling a distance relationship with a source of the partial discharge signal by adjusting generation sensitivity of the partial discharge occurrence timing pulse by controlling a variable amplifier or variable attenuator upon receiving a pulse count feedback from the timing pulse generating unit; and a network communication module communicating with human machine interface (HMI) locally or remotely.

The synchronization comparing unit may variably determine whether the synchronization is performed according to a distance from the source of the partial discharge signal.

The synchronization comparing unit may determine that the timing pulse and the magnitude pulse are not synchronized in the time domain when the distance is greater than a predetermined reference, and remove the partial discharge signal as noise.

The synchronization comparing unit may analog-to-digital convert the partial discharge magnitude pulse signal by using the partial discharge occurrence timing pulse as a trigger, and selectively use a first, second, or third analog-to-digital converter (ADC) according to a speed of the analog-to-digital conversion.

The first ADC may acquire the partial discharge signal by directly sampling an input radio frequency (RF) signal from an RF level without undergoing a modulation process.

The second ADC may acquire the partial discharge signal by sampling, at a high speed, an amplified or attenuated signal received from a variable amplifying unit controlled by the synchronization comparing unit without undergoing a special modulation process.

The third ADC may acquire the partial discharge signal by sampling a peak hold value calculated through a peak hold method of amplifying or attenuating an input signal, modulating the corresponding signal by an RF log detection module, and storing a maximum value in a capacitor.

The partial discharge signal generating unit may selectively use first and second DACs that variably determine topology of each circuit configuration according to the digital-to-analog conversion speed.

The second DAC may further include: a frequency voltage controlled RF generator; an RF level adjusting unit adjusting an RF signal generated by the RF generator; an RF amplifier amplifying the adjusted RF signal; and an output level adjusting unit generating a partial discharge signal by adjusting the generation of the RF burst by the amplification.

In the embodiments, the broadband lossless partial discharge detection and noise removal device may include a remote or local controller. The controller may digitally or analogly control a variable amplifier, a variable attenuator, and a comparator provided in the timing pulse generating unit and a variable amplifier and a variable attenuator provided in the magnitude pulse generating unit as output elements. Also, a TTL signal of the timing pulse generating unit and an output voltage of the magnitude pulse generating unit may be received as input feedback elements.

In embodiments, in the broadband lossless partial discharge detection and noise removal device, in the case of removing partial discharge noise, such as corona, or removing noise according to a distance or detecting a partial discharge signal according to a distance when detecting a partial discharge, the remote or local controller may control the output element and implement the partial discharge noise removal or noise removal and partial discharge signal detection according to a distance upon receiving the input element as feedback.

In embodiments, a broadband lossless partial discharge detection and noise removal system includes: a plurality of partial discharge sources located to be spaced apart from each other by a predetermined distance and generating partial discharge signals mixed with noise; a plurality of partial discharge sensors respectively disposed in the plurality of partial discharge sources; and a data acquisition device separately acquiring a partial discharge signal by distinguishing the partial discharge signal from the partial discharge signals mixed with noise detected through the plurality of partial discharge sensors, wherein the data acquisition device includes a plurality of broadband lossless partial discharge detection and noise removal devices including a partial discharge occurrence timing pulse acquiring unit acquiring a generated timing pulse of a partial discharge signal at the beginning of generation of a partial discharge signal, a partial discharge magnitude pulse acquiring unit acquiring a magnitude pulse of the partial discharge signal, a synchronization comparing unit detecting a partial discharge digital signal determined according to whether the generated timing pulse of the partial discharge signal and the magnitude pulse are synchronized, and a partial discharge signal generating unit detecting a partial discharge pulse obtained by converting the detected partial discharge digital signal into an analog signal.

The plurality of broadband lossless partial discharge detection and noise removal devices may determine that the timing pulse and the magnitude pulse for a partial discharge signal of another partial discharge source detected from a specific partial discharge source, among a plurality of partial discharge sources, disposed to be away at the predetermined distance equal or more than a specific reference are not synchronized with each other in a time domain, remove the partial discharge signal of the other partial discharge source as noise and detect only a partial discharge signal of the specific partial discharge source.

The plurality of broadband lossless partial discharge detection and noise removal devices may simultaneously use various types of a plurality of sensors having different bandwidths, without using a filter.

The disclosed technology may have the following effects. However, it does not mean that a specific embodiment should include all of the following effects or only the following effects, so it should not be understood that the scope of the disclosed technology is limited thereby.

The broadband lossless partial discharge detection and noise removal device according to an embodiment of the present disclosure may effectively detect whether a partial discharge signal is included in an input signal.

The broadband lossless partial discharge detection and noise removal device according to an embodiment of the present disclosure may effectively remove noise and partial discharge-like noise and detect partial discharge even when a partial discharge signal, noise, and partial discharge-like noise are mixed in an input signal.

The broadband lossless partial discharge detection and noise removal device according to an embodiment of the present disclosure is referred to as a T/Q pulse method to which a PD amplification noise attenuation (PANA) method (Korean Patent Application No. 10-2017-0134573) is applied. In the T/Q pulse method of the present disclosure, for a partial discharge signal and a noise signal mixed in the same time period, the partial discharge signal component is amplified more than a reference voltage Vref and the noise component is attenuated more than the reference voltage Vref, giving a differential point based on reference strength vref, and by advancing in the PANA technology that may detect a partial discharge signal using the differential point, the partial discharge detection signal may be converted into a timing pulse signal to acquire a signal at the time when the timing signal was generated, combine the acquired signal with a TTL conversion circuit to detect a partial discharge occurrence timing pulse, and ADC-trigger using a TTL signal to acquire a partial discharge signal, reproduce or produce the partial discharge signal using a DAC or the like, and transmit the same, thereby resultantly obtaining a noise-removed partial discharge signal.

Since the broadband lossless partial discharge detection and noise removal device according to an embodiment of the present disclosure may remove noise and detect partial discharge according to a diagnosis distance, it is possible to remove partial discharge noise, such as air corona, and set a detection boundary. Therefore, a device to be diagnosed may be individually diagnosed, and an occurrence portion may be accurately detected.

Since the broadband lossless partial discharge detection and noise removal device according to an embodiment of the present disclosure does not use any filter in the partial discharge signal detection system, wideband detection is possible and there is no loss due to no frequency limitation.

The broadband lossless partial discharge detection and noise removal device according to an embodiment of the present disclosure acquires a synchronization point signal of a partial discharge occurrence timing pulse and a partial discharge magnitude pulse to detect a partial discharge signal, and since other noise is not synchronized with each other and not acquired, noise may be perfectly removed, and for example, RFI noise, communication noise, EMI noise, and air corona noise may be removed.

The broadband lossless partial discharge detection and noise removal device according to an embodiment of the present disclosure may be applied to a cable partial discharge prevention diagnosis, solid insulation switchgear (SIS), transformer, motor, generator facility partial discharge prevention diagnosis, electric vehicle partial discharge prevention diagnosis, electric vehicle charger It may be applied to partial discharge prevention diagnosis, gas insulation switchgear (GIS) partial discharge prevention diagnosis, UHF partial discharge sensor with noise removal function, bushing partial discharge prevention diagnosis and partial discharge noise removal module, but is not limited thereto.

DETAILED DESCRIPTION

Figure 1:
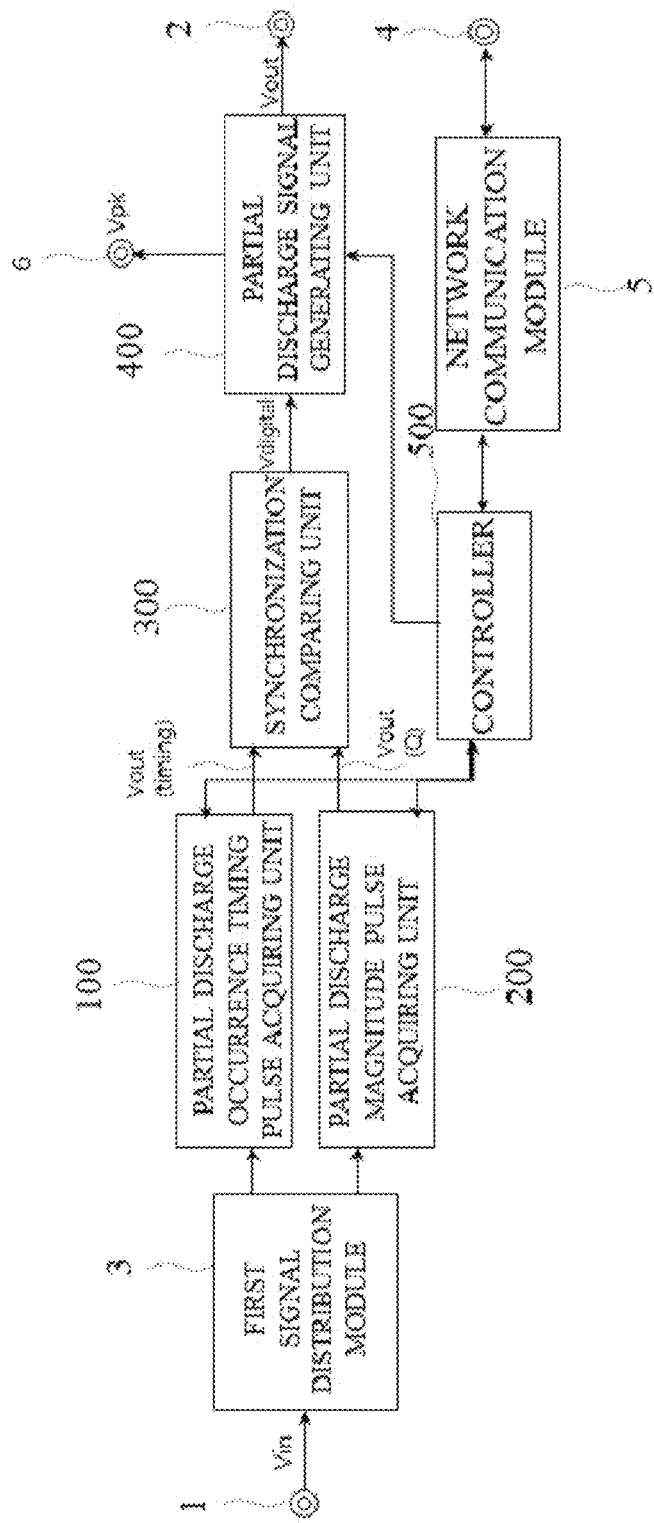
FIG. 1 is a view illustrating a broadband lossless partial discharge detection and noise removal device according to an embodiment of the present disclosure.

In the best mode for carrying out the present disclosure, a broadband lossless partial discharge detection and noise removal device includes a partial discharge occurrence timing pulse acquiring unit acquiring a generated timing pulse of a partial discharge signal at the beginning of generation of a partial discharge signal, a partial discharge magnitude pulse acquiring unit acquiring a magnitude pulse of the partial discharge signal, a synchronization comparing unit detecting a partial discharge digital signal determined according to whether the generated timing pulse of the partial discharge signal and the magnitude pulse are synchronized, and a partial discharge signal generating unit detecting a partial discharge pulse obtained by converting the detected partial discharge digital signal into an analog signal, wherein the synchronization comparing unit detects the corresponding pulse as the partial discharge pulse when the timing pulse and the magnitude pulse of the partial discharge signal are synchronized in the time domain, and determines and removes the corresponding pulse as noise when the timing pulse and the magnitude pulse are not synchronized.

In the best mode for carrying out the present disclosure, a broadband lossless partial discharge detection and noise removal system includes: a plurality of partial discharge sources located to be spaced apart from each other by a predetermined distance and generating partial discharge signals mixed with noise; a plurality of partial discharge sensors respectively disposed in the plurality of partial discharge sources; and a data acquisition device separately acquiring a partial discharge signal by distinguishing the partial discharge signal from the partial discharge signals mixed with noise detected through the plurality of partial discharge sensors, wherein the data acquisition device includes a plurality of broadband lossless partial discharge detection and noise removal devices including a partial discharge occurrence timing pulse acquiring unit acquiring a generated timing pulse of a partial discharge signal at the beginning of generation of a partial discharge signal, a partial discharge magnitude pulse acquiring unit acquiring a magnitude pulse of the partial discharge signal, a synchronization comparing unit detecting a partial discharge digital signal determined according to whether the generated timing pulse of the partial discharge signal and the magnitude pulse are synchronized, and a partial discharge signal generating unit detecting a partial discharge pulse obtained by converting the detected partial discharge digital signal into an analog signal, wherein the plurality of broadband lossless partial discharge detection and noise removal devices may determine that the timing pulse and the magnitude pulse for a partial discharge signal of another partial discharge source detected from a specific partial discharge source, among a plurality of partial discharge sources, disposed to be away at the predetermined distance equal or more than a specific reference are not synchronized with each other in a time domain, remove the partial discharge signal of the other partial discharge source as noise and detect only a partial discharge signal of the specific partial discharge source.

Description of the present disclosure is merely an embodiment for structural or functional explanation, so the scope of the present disclosure should not be construed to be limited to the embodiments explained in the embodiment. That is, since the embodiments may be implemented in several forms without departing from the characteristics thereof, it should also be understood that the above-described embodiments are not limited by any of the details of the foregoing description, unless otherwise specified, but rather should be construed broadly within its scope as defined in the appended claims. Therefore, various changes and modifications that fall within the scope of the claims, or equivalents of such scope are therefore intended to be embraced by the appended claims.

Terms described in the present disclosure may be understood as follows.

While terms, such as "first" and "second," etc., may be used to describe various components, such components must not be understood as being limited to the above terms. For example, a first component may be named a second component and, similarly, the second component may also be named the first component.

It will be understood that when an element is referred to as being "connected to" another element, it may be directly connected to the other element or intervening elements may also be present. In contrast, when an element is referred to as being "directly connected to" another element, no intervening elements are present. In addition, unless explicitly described to the contrary, the word "comprise" and variations, such as "comprises" or "comprising," will be understood to imply the inclusion of stated elements but not the exclusion of any other elements. Meanwhile, other expressions describing relationships between components, such as "~between", "immediately ~between" or "adjacent to ~" and "directly adjacent to ~" may be construed similarly.

Singular forms "a", "an" and "the" in the present disclosure are intended to include the plural forms as well, unless the context clearly indicates otherwise. It will be further understood that terms, such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

Identification letters (e.g., a, b, c, etc.) in respective steps are used for the sake of explanation and do not describe order of respective steps. The respective steps may be changed from a mentioned order unless specifically mentioned in context. Namely, respective steps may be performed in the same order as described, may be substantially simultaneously performed, or may be performed in reverse order.

Unless otherwise defined, all terms used herein, including technical or scientific terms, have the same meanings as those generally understood by those with ordinary knowledge in the field of art to which the present disclosure belongs. Such terms as those defined in a generally used dictionary are to be interpreted to have the meanings equal to the contextual meanings in the relevant field of art, and are not to be interpreted to have ideal or excessively formal meanings unless clearly defined in the present application.

FIG. 1 is a view illustrating a broadband lossless partial discharge detection and noise removal device according to an embodiment of the present disclosure.

The present disclosure relates to a broadband lossless partial discharge detection and noise removal device 1000. More specifically, unlike the conventional front stage filter method and/or rear stage high-speed software processing method, the broadband lossless partial discharge detection and noise removal device 1000 determines whether the front stage partial discharge occurrence timing pulse and the partial discharge magnitude pulse are synchronized and remove a signal irrelevant to synchronization, thereby detecting a partial discharge signal and effectively removing noise. In an embodiment, the broadband lossless partial discharge detection and noise removal device 1000 has a small volume and excellent broadband noise removal performance, and thus may effectively detect a partial discharge signal over a wide band without loss. For example, in the partial discharge occurrence timing pulse of the broadband lossless partial discharge detection and noise removal device 1000, a rising time and pulse width increase and an amplitude decreases according to the characteristics of the partial discharge signal as the partial discharge signal moves away from a partial discharge source. Therefore, the broadband lossless partial discharge detection and noise removal device 1000 may remove partial discharge noise, such as outside air corona or motor noise using the selectivity of a distance relationship in which partial discharge occurrence timing pulses are not generated after a certain distance.

In general, in the process of detecting a partial discharge signal, noise removal or suppression analyzed by acquiring a signal of −65 dBm or less, which is a very fine signal, is a very important factor in detecting a partial discharge signal. However, when various signal bands overlap a partial discharge detection band, it is difficult to suppress such noise because of a similar partial discharge signal very similar to a partial discharge signal. However, all signals including the partial discharge signal have a constant rising time and signal width. The broadband lossless partial discharge detection and noise removal device 1000 may detect a partial discharge occurrence timing pulse and a partial discharge magnitude pulse and detecting a common portion in which the two pulses are synchronized (in the time domain), thereby detecting only the partial discharge signal and thus suppressing noise.

Referring to FIG. 1, the broadband lossless partial discharge detection and noise removal device 1000 may include an input port 1, an output port 2, a communication port 4, a network communication module 5, and a first signal distribution module 3, a partial discharge occurrence timing pulse acquiring unit 100, a partial discharge magnitude pulse acquiring unit 200, a synchronization comparing unit 300, a partial discharge signal generating unit 400, and a controller 500.

In an embodiment, the partial discharge occurrence timing pulse acquiring unit 100 may acquire a partial discharge occurrence timing pulse corresponding to the occurrence timing of the partial discharge signal appearing at the beginning of the partial discharge signal.

In an embodiment, the partial discharge magnitude pulse acquiring unit 200 may acquire a partial discharge magnitude pulse as a pulse indicating a magnitude of the partial discharge signal, and may be implemented by applying a pair of log amplifiers or dual log amplifiers. For example, although it is advantageous to implement a circuit for the partial discharge magnitude pulse acquiring unit 200 to use a pair of the same model, log amplifiers having different characteristics may also be used.

In an embodiment, the synchronization comparing unit 300 may detect a partial discharge pulse determined according to whether the occurrence timing pulse of the partial discharge signal and the magnitude pulse are synchronized. For example, the synchronization comparing unit 300 may detect whether the partial discharge occurrence timing pulse and the partial discharge magnitude pulse are synchronized in the time domain, determine the synchronized pulse as a partial discharge pulse, and may determine pulses that are not synchronized as noise. In an embodiment, the synchronization comparing unit 300 may be implemented by applying a microprocessor having an internal ADC or a separate ADC, and the partial discharge magnitude pulse acquiring unit 200 may be implemented by applying a pair of log amplifiers. Here, the pair of log amps may perform analog operations, acquire result values, and pass them to the synchronization comparing unit 300.

The partial discharge signal generating unit 400 may generate a partial discharge signal through the detected partial discharge pulse. In an embodiment, the partial discharge signal generating unit 400 may be implemented by applying a digital-to-analog converter (DAC). Here, a magnitude of the signal when the DAC signal is generated may be provided as the same magnitude as the magnitude of the partial discharge signal acquired from the ADC or amplified or attenuated by the synchronization comparing unit 300. In an embodiment, when the DAC signal is generated, the magnitude, a burst period, a frequency, and a waveform of the signal may be determined by the synchronization comparing unit 200.

As a result, the broadband lossless partial discharge detection and noise removal device 1000 may acquire the partial discharge occurrence timing pulse through the partial discharge occurrence timing pulse acquiring unit 100 and acquire the magnitude pulse of the partial discharge signal through the partial discharge magnitude pulse acquiring unit 200. In this process, the broadband lossless partial discharge detection and noise removal device 1000 may receive the partial discharge occurrence timing pulse as a trigger signal through the synchronization comparing unit 300 (e.g., a microprocessor), detect the magnitude of the partial discharge signal by the ADC, and determine the magnitude which is equal to as that of the detected partial discharge signal or which is attenuated or amplified, a burst period, a frequency and a waveform to reproduce or produce only the partial discharge signal by the DAC, thereby effectively suppressing noise and detecting the partial discharge signal. For example, in the broadband lossless partial discharge detection and noise removal device 1000, the partial discharge occurrence timing pulse is generated when the partial discharge signal is generated (immediately at the beginning of the partial discharge signal period), and thus, noise may be discriminately processed very accurately and the partial discharge signal may be acquired. More specifically, the broadband lossless partial discharge detection and noise removal device 1000 may achieve the effect of the present disclosure by using whether the partial discharge occurrence timing pulse and the partial discharge magnitude pulse are synchronized. That is, the broadband lossless partial discharge detection and noise removal device 1000 may measure the partial discharge magnitude pulse simultaneously or substantially simultaneously when the partial discharge occurrence timing pulse is acquired to purely acquire only the partial discharge signal to reproduce the partial discharge signal without noise and use the same in various devices. In an embodiment, the broadband lossless partial discharge detection and noise removal device 1000 may measure the partial discharge magnitude simultaneously or substantially simultaneously when the partial discharge occurrence timing pulse is acquired, and reproducing and transmitting the partial discharge signal, so that it may be used in an active type partial discharge detection sensor module having a noise removal function.

Figure 2:
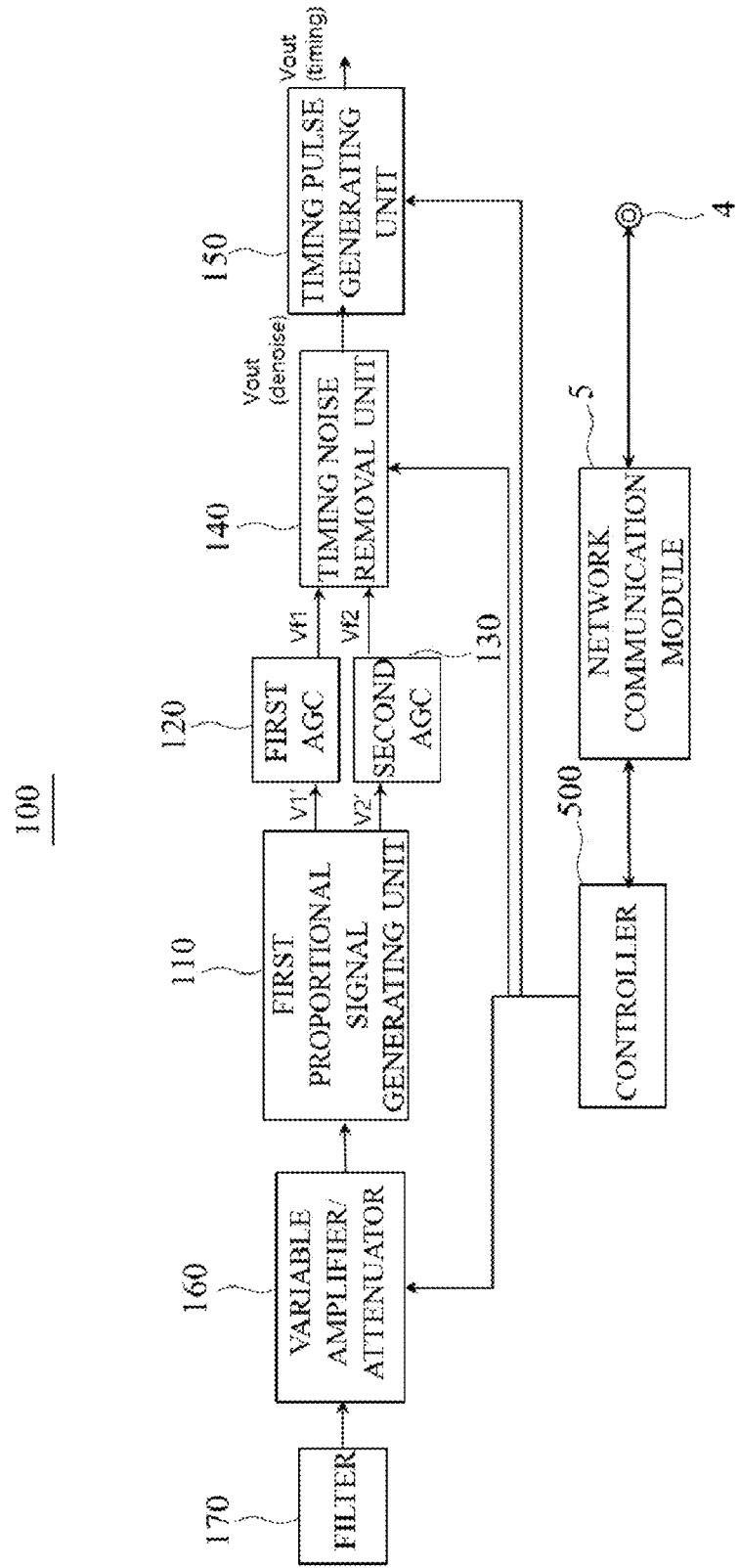
FIG. 2 is a view illustrating a partial discharge occurrence timing pulse acquiring unit of FIG. 1.

FIG. 2 is a view illustrating a partial discharge occurrence timing pulse acquiring unit of FIG. 1.

Referring to FIG. 2, the partial discharge occurrence timing pulse acquiring unit 100 may include a communication port 4, a network communication module 5, a proportional signal generating unit 110, a first AGC (AGC) 120, a second AGC 130, a timing noise removing unit 140, a timing pulse generating unit 150, a variable amplifier/variable attenuator 160, a filter 170, and a controller 500.

In an embodiment, the partial discharge occurrence timing pulse acquiring unit 100 may include the filter 170 attached at a front stage in order to acquire a more accurate partial discharge occurrence timing pulse. In an embodiment, the partial discharge occurrence timing pulse acquiring unit 100 may include a variable/fixed amplifier or a variable/fixed attenuator 160 at a front stage in order to acquire a more accurate partial discharge occurrence timing pulse.

In an embodiment, the partial discharge occurrence timing pulse acquiring unit 100 may include the controller 500 capable of controlling remotely or locally automatically (or manually) the variable amplifier or variable attenuator at a front stage in order to acquire a more accurate partial discharge occurrence timing pulse. More specifically, the partial discharge occurrence timing pulse acquiring unit 100 may include the controller 500 capable of controlling the variable amplifier/attenuator 160 at a front stage to acquire a partial discharge occurrence timing pulse that generates a trigger signal according to a distance in order to remove partial discharge noise, such as corona noise. In an embodiment, the controller 500 may control the variable amplifier/attenuator 160 by receiving a pulse count as feedback from the timing pulse generating unit 150 to control a distance relationship.

The first proportional signal generating unit 110 may generate first and second proportional signals according to an input signal. More specifically, the first proportional signal generating unit 110 may be electrically connected to the variable amplifier/attenuator 160 at an input terminal to receive an input signal through the variable amplifier/attenuator 160, generate first and second proportional signals based on the received input signal, and provide the first and second proportional signals generated as being electrically connected to an input terminal of the first and second AGCs 120 and 130 at an output terminal to the input terminal of the first and second AGCs 120 and 130.

Figure 8:
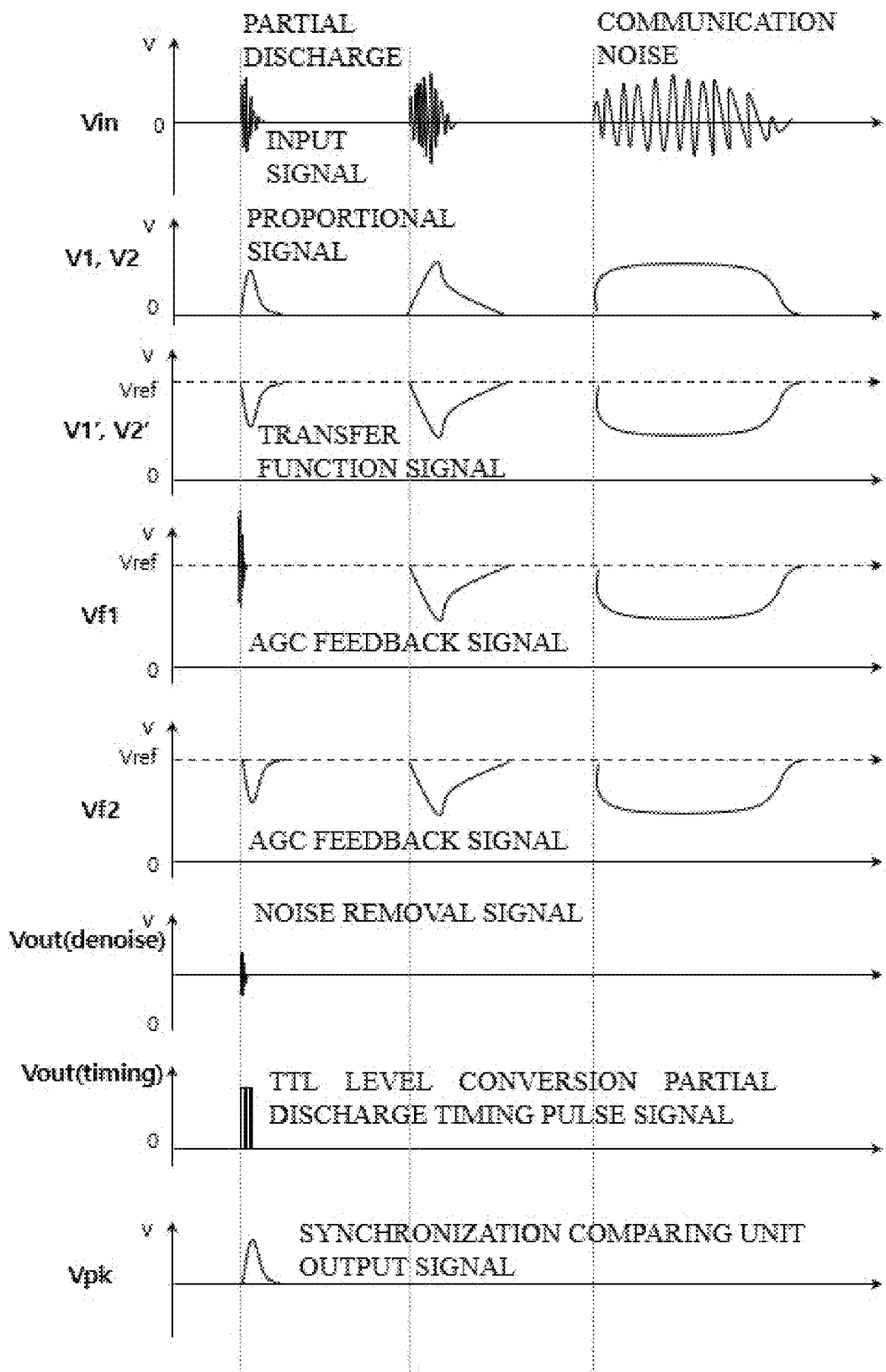
FIG. 8 is a view illustrating a process of acquiring a partial discharge occurrence timing pulse of a broadband lossless partial discharge detection and noise removal device according to an embodiment of the present disclosure.

In an embodiment, the first proportional signal generating unit 110 may generate the first and second proportional signals proportional to the intensity of at least one of the amplitude, frequency, and power of the input signal, and when, for example, an input signal Vin is received, the first proportional signal generating unit 110 may generate proportional signals V1' and V2' as DC output voltages proportional to power appearing at the corresponding input terminal (refer to the graph of FIG. 8).

Figure 3:
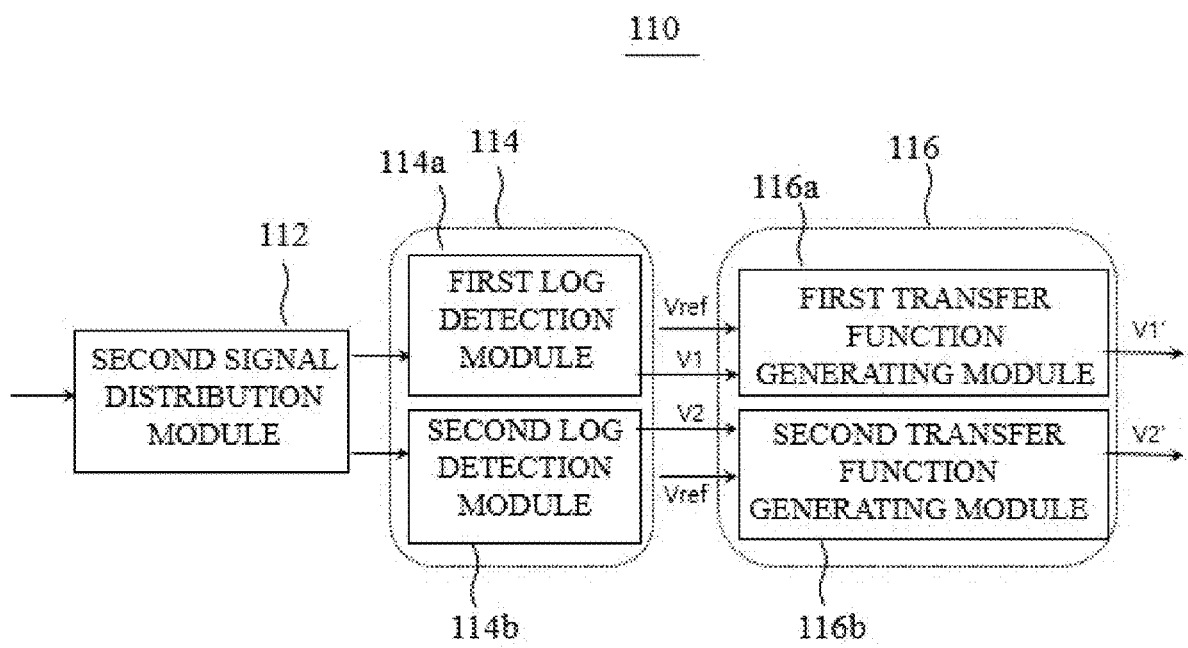
FIG. 3 is a view illustrating a first proportional signal generating unit of FIG. 2.

FIG. 3 is a view illustrating a first proportional signal generating unit of FIG. 2.

Referring to FIG. 3, the first proportional signal generating unit 110 includes a second signal distribution module 112, first and second log detection modules 114, and first and second transfer function generating modules 116.

The second signal distribution module 112 may distribute at least two input signals, and in an embodiment, may generate at least two signals having the same phase and amplitude as the corresponding signal based on the input signal. The second signal distribution module 112 may be electrically connected to the input terminal of the first and second log detection modules 114 at an output terminal, generate two signals having the same phase and amplitude based on an output signal of the first signal distribution module from an input signal received through the variable amplifier/variable attenuator 160 and provide the two signals to each of the first log detection module 114*a* and the second log detection module 114*b*, respectively.

In an embodiment, the second signal distribution module 112 may be implemented by including an amplifier (not shown) that amplifies an input signal to a predetermined specific power gain (e.g., 10 dB), split the amplified signal amplified through the corresponding amplifier as a plurality of signals, and may be implemented as an 1:N (N is a natural number greater than or equal to 2) splitter.

The first and second log detection modules 114 may generate first and second proportional signals proportional to a size of at least one of amplitude, frequency, and power of an input signal. In an embodiment, the first and second log detection modules 114 may be provided to correspond to the number of signal distributions of the second signal distribution module 112, and when the second signal distribution module 112 is implemented as a 1:3 divider, it may include first to third log detection modules. The first log detection module 114*a* may receive a first signal distributed from the second signal distribution module 112, and the second log detection module 114*b* may receive a second signal distributed from the signal distribution module 112, and the first and second log detection modules 114 may respectively generate first and second proportional signals V1 and V2 as a DC output voltage proportional to the signal power appearing at the corresponding input terminal (refer to the graph in FIG. 8).

In an embodiment, each of the first and second log detection modules 114 may be implemented as a log detector generating an output signal by demodulating a log value of an input signal. Here, the log detector generically refers to cases expressed as a log detector, a log amp, a log amplifier, a logarithmic amplifier, an RF power detector, a log amplifier detector, and the like. In this case, a measured value of a total node power at an RF input port may represent total power to be converted into DC including signal, noise, and interference.

In another embodiment, each of the third and fourth log detection modules 214 may be implemented through at least one of an amplifier, an envelope detector, a diode detector and an integrator or through a combination of at least two thereof, and may be implemented, for example, through a combination of an RF amplifier and an envelope detector or through a combination of an amplifier and an integrator.

Each of the third and fourth transfer function generating modules 216 may output a transfer function signal by converting a proportional signal input to an input terminal based on a reference voltage and a transfer function. The third transfer function generating module 216*a* may receive the third proportional signal V3 from the third log detection module 214*a*, generate a first transfer function signal V3' based on the reference voltage Vref and the transfer function and output the same to an input terminal of the first AGC 120, and the fourth transfer function generating module 216*b* may receive the fourth proportional signal V4 from the fourth log detection module 214*b*, generate a fourth transfer function signal V4' based on the same reference voltage Vref and the same transfer function, and output the same to the input terminal of the fourth AGC 230.

Each of the third and fourth transfer function generating modules 216 may be provided with the reference voltage Vref having a specific DC voltage level, and at least one of a range of an input/output signal, a voltage characteristic of an output signal compared to an input signal, and a frequency characteristic may be defined through a transfer function representing linear characteristics of the input/output signals. Here, the transfer function may be designed by a designer or a user, and the input value and range of the reference voltage may be adjusted by the user. In an embodiment, it is advantageous for the transfer function, that is, a slope value of input to output, to have a negative slope characteristic in terms of operation implementation, but is not necessarily limited thereto and may have a positive slope characteristic. These contents will be described in more detail with reference to FIG. 4.

Figure 4:
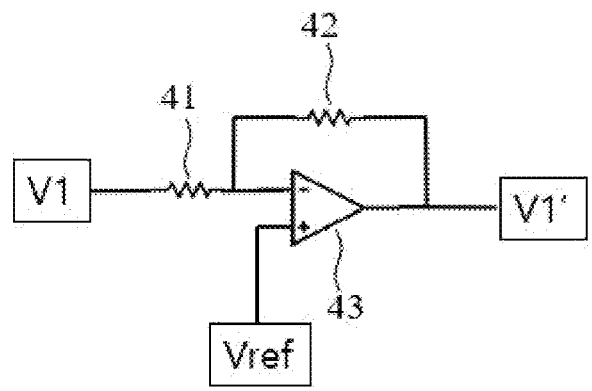
FIG. 4 is a view illustrating first and second transfer function generating modules of FIG. 3.

FIG. 4 is a view illustrating first and second transfer function generating modules of FIG. 3.

Referring to FIG. 4, each of the first and second transfer function generating modules 116 may include first and second resistors 41 and 42 and an amplifier 43.

The first resistor 41 may be disposed between an input terminal and a first input terminal of the amplifier 43, and the second resistor 42 may be disposed between a second input terminal and an output terminal of the amplifier 43. In an example, each may have a resistance value of several kOhms.

The amplifier 330 may receive a proportional signal from one of the first and second log detection modules 114 through the first resistor 41 by the first input terminal, receive the reference voltage Vref by the second input terminal, and perform amplification based on feedback through the second resistor 42 to generate and output the transfer function signal V1' (or V2') generated based on the reference voltage Vref and corresponding to the transfer function characteristics (refer to the graph in FIG. 8). Accordingly, the amplifier 43 may output a transfer function signal reduced by a magnitude corresponding to the input proportional signal based on the reference voltage Vref.

Each of the first and second transfer function generating modules 116 may be implemented such that a DC output voltage has the characteristic of the transfer function proportional to or inversely proportional to the total RF signal power present at the corresponding detector input. In an embodiment, each of the first and second transfer function generating modules 116 may be implemented through a differential amplifier receiving an inverting input signal and a non-inverting input signal as input signals, and the characteristics of the transfer function defining an operating range of the corresponding transfer function generating module may be determined based on Equation 1 below. Here, the slope represents a DC output slope characteristic of the output signal compared to power appearing at the input terminal defined in the transfer function. Here, VO1 and VO2 refer to output voltages output from two output terminals, and PI1 and PI2 refer to signal powers appearing at two input terminals. Here, it is advantageous for the transfer function, that is, the slope value of input to output, to have a negative slope characteristic in terms of operation implementation, but is not necessarily limited thereto, and may have a positive slope characteristic.

$$\text{Slope}=(VO2-VO1)/(PI2-PI1) \qquad \text{[Equation 1]}$$

In an embodiment, each of the first and second transfer function generating modules 116 may have an inverse proportional transfer function that converts a value of −60 dBm to +5 dBm of the corresponding input proportional signal to a value within 1.7 Vdc to 0.5 Vdc. In this case, the reference voltage Vref may be formed to be around 2.4 Vdc, and may be formed to be within a specific standard error range based on 2.4 Vdc, for example.

In another embodiment, each of the first and second transfer function generating modules 116 may have a proportional transfer function that converts the value of −60 dBm to +5 dBm of the corresponding input proportional signal into a value within 0.5 Vdc to 1.7 Vdc. At this time, the reference voltage Vref may be formed to be around 0.5 Vdc.

In the above, it is described that the signal distribution module 112, the first and second log detection modules 114, and the first and second transfer function generating modules 116 are sequentially arranged in the first proportional signal generating unit 110, but the first proportional signal generating unit 110 is not limited thereto and may be implemented through at least some of them, and the arrangement order, arrangement number, and connection structure of the components may be implemented in various circuit forms through various embodiments for generating a plurality of proportional signals proportional to the amplitude, frequency, or power of an input signal.

The first AGC 120 performs automatic gain control on the partial discharge detection signal generated based on the first proportional signal and fed back to an input terminal through at least one partial discharge capacitor. The first AGC 120 may perform automatic gain control (AGC) based on the first proportional signal, and in the process of automatic gain control, the output signal generated at the output terminal may be processed through at least one partial discharge capacitor and fed back to a feedback terminal corresponding to another input terminal. In an embodiment, the first AGC 120 may perform feedback through at least one partial discharge capacitor and at least one resistor.

In an embodiment, when the first transfer function signal V1' is input from the proportional signal generating unit 110, the first AGC 120 may perform automatic gain control, process the partial discharge detection signal Vf1 into an automatic gain control feedback signal Vf1' generated through at least one partial discharge capacitor in the process of automatic gain control, and transfer the same to the feedback terminal to feed back so that the partial discharge detection signal Vf is modified depending on whether the partial discharge signal is included or not. For example, if the partial discharge signal is included in the input signal Vin, the first AGC 120 may generate the partial discharge detection signal Vf including a high frequency component according to the characteristics of the corresponding partial discharge signal, transforms the partial discharge detection signal Vf into an automatic gain control feedback signal Vf1' through at least one partial discharge capacitor and feedback to the feedback terminal, and accordingly, the gain in the automatic gain control process is modified to induce signal transformation of the partial discharge detection signal Vf according to a high frequency component (case of partial discharge in the graph of FIG. 8), and if not included, signal transformation of the partial discharge detection signal Vf may not be induced (case of partial discharge-like noise or communication noise in the graph of FIG. 8). These contents will be described in more detail with reference to FIG. 5.

Figure 5:
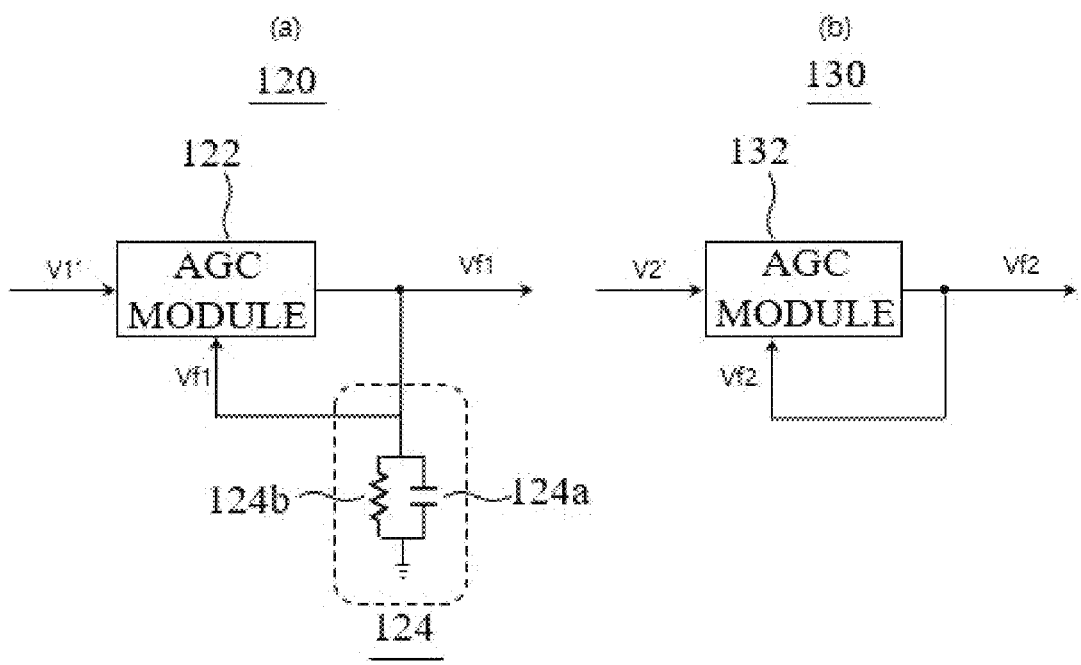
FIG. 5 is a view illustrating first and second AGCs of FIG. 2.

FIG. 5 is a block diagram illustrating configurations of a first AGC and a second AGC in FIG. 2. More specifically, FIG. 5(a) shows the first AGC 120, and FIG. 5(b) shows the second AGC 130.

Referring to FIG. 5(a), the first AGC 120 may include an AGC module 122 and a partial discharge feedback module 124.

The AGC module 122 may perform automatic gain control on the input signal, and in an embodiment, the AGC module 122 may be implemented as an auto gain control (AGC) or an automatic volume control (AVC) which is a closed loop feedback control circuit that provides controlled signal amplitude based on an amplitude change of a signal fed back at the output despite a change in amplitude of the input signal. The AGC module 122 may reduce the gain to reduce the volume of the output signal when the strength of the input signal is strong, and increase the gain to increase the volume of the output signal when the strength of the input signal is weak, and may dynamically control an input/output gain based on an average signal level or a maximum output signal level of the gain control feedback signal.

The partial discharge feedback module 124 may be connected to the output terminal and the feedback terminal of the AGC module 122, may process the output signal of the AGC module 122 and feed it back to the feedback terminal. Each partial discharge feedback module 124 may include least one partial discharge capacitor 124a and/or at least one partial discharge resistor 124b connected at one end to at least one of the output terminal and the feedback terminal of the AGC module 122, but the partial discharge capacitor may also be used alone.

In an embodiment, the partial discharge feedback module 124 may feedback the automatic gain control feedback signal Vf1' formed through processing of the partial discharge detection signal Vf1 at the feedback terminal of the AGC module 122 through a parallel configuration of at least one partial discharge capacitor 124a and at least one partial discharge resistor 124b. For example, when the partial discharge signal component is reflected in the output partial discharge detection signal, the partial discharge feedback module 124 may induce temporary over amplification and fluctuation by changing an amplification degree g of the AGC module 122 as a charge-discharge and feedback action between the partial discharge capacitor 124a and the partial discharge resistor 124b configured as an RC parallel circuit.

In an embodiment, if there is a resistor provided inside the AGC module 122 and the partial discharge feedback module 124 purely includes mainly resistance components, the temporary over amplification and fluctuation are difficult to occur, but the partial discharge feedback module 124 including an inductance or capacitance component responds to a specific value of the modulation frequency in which the partial discharge signal is modulated with a log value, and changes the amplification degree g of the AGC module 122 to cause temporary over amplification and fluctuation or resonance to generate a pulse component exceeding a normal output value. In particular, when the partial discharge feedback module 124 has a negative slope transfer function characteristic, for example, if the partial discharge feedback module 124 purely includes resistance components, the output value of the AGC module 122 may be formed at 2.6 VDC or less, but when a phenomenon such as charging, over amplification and fluctuation, or resonance or oscillation, temporarily occurs, a temporary overpower value of 2.6 VDC or more may be formed and, accordingly, a pulse exceeding the reference value may be formed. In an embodiment, the specific value of the modulation frequency in which the partial discharge signal is modulated with a log value refers to a modulation signal whose rising time partially or entirely includes 6 nS to 10 nS, but may be changed according to a circuit configuration, component characteristics, PCB material and pattern characteristics, etc. and may include a case in which the input RF signal undergoes amplification or attenuation correction considering loss in the circuit within the range of −65 dBm to 5 dBm, but this may also be changed according to the circuit configuration, component characteristics, PCB material and pattern characteristics, etc. In general, if the amplification is higher than the signal condition, a relationship capable of better detecting the occurrence timing of a low-level partial discharge signal may be formed.

While the partial discharge signal is a burst including high-frequency components with a pulse width of several nS, noise may be formed as a burst of relatively low-frequency components with a wide pulse width. In an embodiment, the burst of the partial discharge signal has a shape of an impulse and the noise has a shape of a gentle triangular wave when the log detector circuit is used. In an embodiment, the impulse-shaped waveform includes high-frequency components on the frequency spectrum and the gentle triangular wave includes relatively low-frequency components, so that the reactions in the partial discharge feedback module 124 configured as an RC parallel circuit are different from each other. More specifically, the RC parallel circuit of the partial discharge feedback module 124 including specific R and C values responds to the impulse but does not respond to the gentle triangular wave (refer to the graph of FIG. 8).

In an embodiment, the partial discharge feedback module 124 is connected to the corresponding output terminal when the partial discharge detection signal is output from the output terminal of the AGC module 122 and form a charging-discharging feedback through the RC parallel circuit including a capacitor and a resistor each having an appropriate value to lower a high frequency component in the partial discharge detection signal to resultantly lower the strength of the output signal, and feedback an automatic gain control feedback signal having the lowered high frequency component, not an automatic gain control feedback signal as the output signal as it is, to the AGC module 122 to temporarily increase an amplification degree for AGC or temporarily change the output slope g, so that the AGC module may temporarily generates over amplification or fluctuation according to the feedback.

Figure 6:
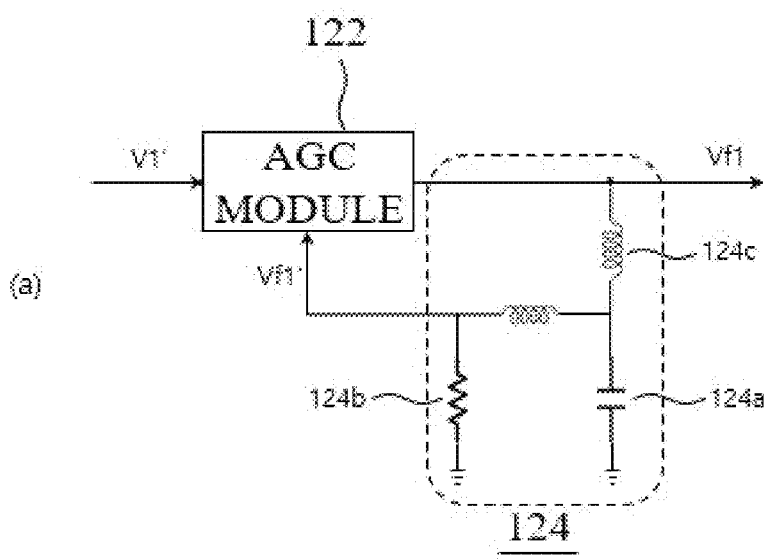
FIG. 6 is a view illustrating another embodiment of a partial discharge feedback module in FIG. 5.
Figure 6:
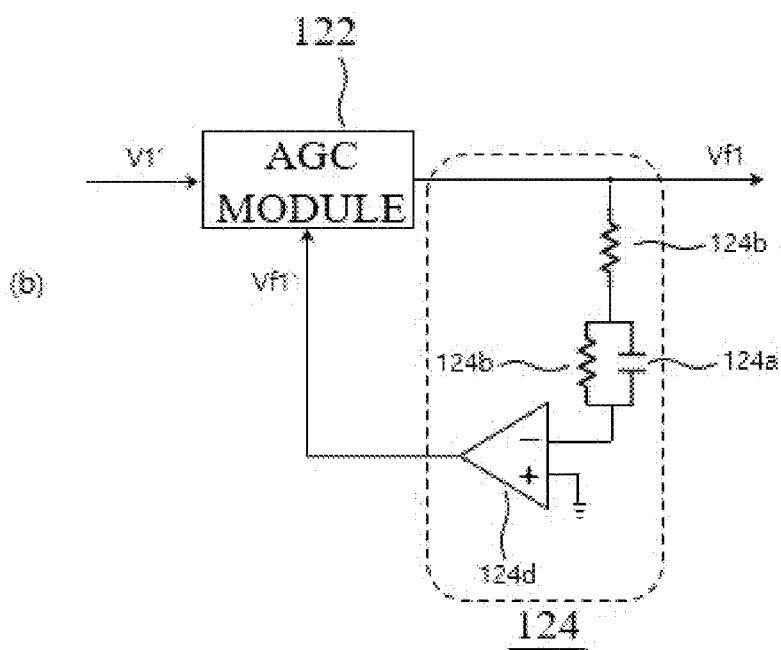

The partial discharge feedback module 124 may be implemented through various other components of embodiments. In an embodiment, the partial discharge feedback module 124 may be implemented as at least one RC parallel circuit including a single capacitor and a single resistor, as described above, and in other embodiments, the partial discharge feedback module 124 may be configured through a combination of at least some of at least one partial discharge capacitor 124a, at least one partial discharge resistor 124b, at least one partial discharge inductor 124c, and at least one partial discharge amplifier 124d as shown in FIG. 6, is not limited thereto and may be implemented through components of various combinations configured so that a corresponding signal transformation is fed back in the automatic gain control process of the AGC module 122 by applying signal transformation to an output signal to correspond to the characteristic of the partial discharge signal.

The first AGC 120 feeds back the intensity of the amplitude or frequency of the partial discharge detection signal to an input terminal through at least one partial discharge capacitor 124a, and if the partial discharge signal is reflected in the corresponding partial discharge detection signal, temporary over amplification may be induced in the process of AGC.

For example, if the partial discharge signal is included in the input signal Vin, the first AGC 120 may generate the partial discharge detection signal Vf1 reflecting the partial discharge signal component in the process of performing AGC regarding the input transfer function signal V1' input by reflecting the partial discharge signal component, and the processed AGC feedback signal Vf1' may be fed back through the partial discharge feedback module 124 and automatically controlled so that a voltage gain for AGC is temporarily increased to perform temporary over amplification, and through this process, the modified partial discharge detection signal Vf1 compared to the transfer function signal V1' may be output (case of partial discharge in the graph of FIG. 8). For another example, if the partial discharge signal is not included in the input signal Vin, the first AGC 120 receives feedback of the AGC feedback signal Vf1' which is not separately processed through the partial discharge feedback module 124 in the process of performing AGC regarding the transfer function signal V1 input by reflecting the partial discharge-like noise or communication nose component, and automatically control the voltage gain for AGC so that there is no over amplification, and through this process, it is possible to output a partial discharge detection signal Vf1 that is not modified or modified less than the reference range compared to the transfer function signal V1' (case of partial discharge-like noise or communication noise in the graph of FIG. 8). As a result, the first AGC 120 may output the partial discharge detection signal Vf1 having different waveform characteristics depending on whether or not the partial discharge signal is included.

In an embodiment, the first AGC 120 may control to calculate a voltage AGC factor g based on Equation 2 below and output a partial discharge detection signal with a voltage gain corresponding to the calculated voltage AGC factor g. In addition, according to the feedback through the partial discharge feedback module 124, the voltage AGC factor g may be adjusted in real time and reflected in the voltage gain adjustment. For example, assuming a partial discharge occurrence situation, as shown in FIG. 8, the first AGC 120 receives feedback of the AGC feedback signal Vf1' having a modified intensity of amplitude and frequency by the partial discharge feedback module 124 from the partial discharge detection signal Vf1, calculates the AGC factor g as a high value to temporarily increase the voltage gain, perform temporary over amplification on the first transfer function signal V1' (or first proportional signal V1') due to lowering of input feedback lowered according to the temporary increase, immediately reflect the occurrence of partial discharge in the partial discharge detection signal Vf1, and as a result, output the temporarily over amplified partial discharge detection signal Vf1 from a corresponding time point through a series of feedback. In an embodiment, the AGC 130 may perform AGC so that the average voltage gain becomes 1 when such temporary over amplification does not occur.

In an embodiment, the AGC 130 temporarily has a partial discharge signal having a higher or lower fluctuation signal value based on Vref as a result of the temporary over amplification in a signal section including the partial discharge signal, may have a noise signal having a value lower than Vref in a section without a partial discharge signal (refer to Vf1 in the graph of FIG. 8)

$$g = \frac{v'_1}{v'_{f1}} \qquad \text{[Equation 2]}$$

$$v_{f1} = g \times v'_1$$

(Here, g is a AGC factor, that is, a voltage amplification degree or a slope characteristic of an output voltage relative to an input, $v_1'$ denotes a transfer function signal, $v_{f1}$ denotes a partial discharge detection signal, and $V_{f1}$ denotes AGC feedback signal)

The first AGC 120 filters a specific frequency band from the partial discharge detection signal through at least one partial discharge capacitor 124a having one end connected to the output terminal and the other end connected to ground, and providing feedback to the corresponding automatic gain control process. In an embodiment, the first AGC 120 may filter a high-frequency signal outside a predetermined specific frequency band in the frequency response characteristics of the partial discharge detection signal through the partial discharge feedback module 124 including an RC parallel circuit and provide feedback a partial discharge loop filter signal modified from the partial discharge detection signal to the amount of charges charged and discharged in the filtering process to the automatic gain control process of the AGC module 122. For example, the partial discharge feedback module 124 may function as a low pass filter (LPF) through the RC coupling configuration and form a resonance point for a specific frequency band, and may feedback the automatic gain control feedback signal Vf1' obtained by filtering signals of a frequency band of 500 MHz or higher from, for example, the partial discharge detection signal Vf1 to the AGC module 122.

At this time, in an embodiment, the partial discharge capacitor 124a may be designed to have a capacitance value of 30 pF to 300 pF, or in the case of a commercial log amplifier having a pulse response time, that is, a fall time/rise time of 6 ns/8 ns, the partial discharge capacitor 124a may be designed to have a capacitance value of 55 pF to 56 pF, and the partial discharge resistor 124b may be designed to have a value of several kohms to hundreds of kohms depending on the capacitor design range of the partial discharge capacitor 124a, and, for example, may be designed to have a resistance value of 20 kOhm to 40 kOhm. In an embodiment, the element value may be adjusted or varied in consideration of a length of a pattern, a width of the pattern, and permittivity of a material in the design of a PCB pattern.

As described above, in an embodiment, the partial discharge feedback module 124 may perform feedback through at least one partial discharge capacitor 124a and at least one partial discharge resistor 124b, and in another embodiment, feedback may be performed through a low pass filter (LPF) or a high pass filter (HPF) implemented through a combination of at least two of a capacitor, an inductor, a resistor, and an amplifier. For example, as shown in FIG. 6(a), the partial discharge feedback module 124 may include the partial discharge capacitor 124a, the partial discharge resistor 124b, and the partial discharge inductor 124c, and the partial discharge feedback module 124 may function as an LPF or as a module with a specific resonance point. In another embodiment, as shown in FIG. 6(b), the partial discharge feedback module 124 may include the partial discharge capacitor 124a, the partial discharge resistor 124b, and the partial discharge amplifier 124d, and through this combination, the partial discharge feedback module 124 may function as an LPF.

In the above, exemplary configurations for implementing the partial discharge feedback module 124 have been described, but the present disclosure is not limited thereto, and the output signal of the AGC module 122 may be modified and fed back to be configured in various required forms in relation to over amplification when partial discharge occurs, a VGC factor g, a slope characteristic of an input to output voltage, and the function of inducing fluctuation.

In an embodiment, the first log detection module 114a, the first transfer function generating module 116a, and the AGC module 122 of FIG. 3 may be replaced with the first commercial log amplifier, in particular, the first commercial log amplifier having an output log value as a negative slope, and the partial discharge feedback module 124 may be disposed between a setpoint input port capable of controlling an output slope of the log amplifier and an output port of the log amplifier. In an embodiment, the second log detection module 114b, the second transfer function generating module 116b, and the AGC module 132 may be replaced with a second commercial log amplifier, and the first commercial log amplifier and the second commercial log amplifier may correspond to products with the same characteristics.

The second AGC 130 performs automatic gain control based on a partial discharge comparison signal generated based on the second proportional signal and fed back to the input terminal.

Referring to FIG. 5(b), the second AGC 130 may include the AGC module 132. In an embodiment, when the second proportional signal or the second transfer function signal is received, the second AGC 130 may perform AGC on the input received through the AGC module 132 and generate a partial discharge comparison signal by feeding back an output signal to the feedback terminal among the input terminal. For example, the second AGC 130 may output the partial discharge comparison signal Vf2 which is not modified compared to the second proportional signal (or the second transfer function signal V2') or which is modified to be less than the reference range through a series of processes of generating the partial discharge detection signal Vf2 by performing AGC on the second proportional signal (or the second transfer function signal V2') received regardless of whether the partial discharge signal is included or not and feeding back the partial discharge detection signal generated in the process of AGC to the feedback terminal (refer to the graph of FIG. 8). As a result, the partial discharge detection signal Vf1 generated by the first AGC 120 and the partial discharge comparison signal Vf2 generated by the second AGC 130 may be output as analog signals having different values depending on whether the partial discharge signal is included in the input signal. In an embodiment, the first AGC 120 and the second AGC 130 may further include a resistor of several kohms disposed between the first AGC 120 and the second AGC 130 and the input terminal of the noise removal unit 140 to adjust the output impedance in the process of delivering an output signal to the input terminal of the timing noise removal unit 140.

Figure 7:
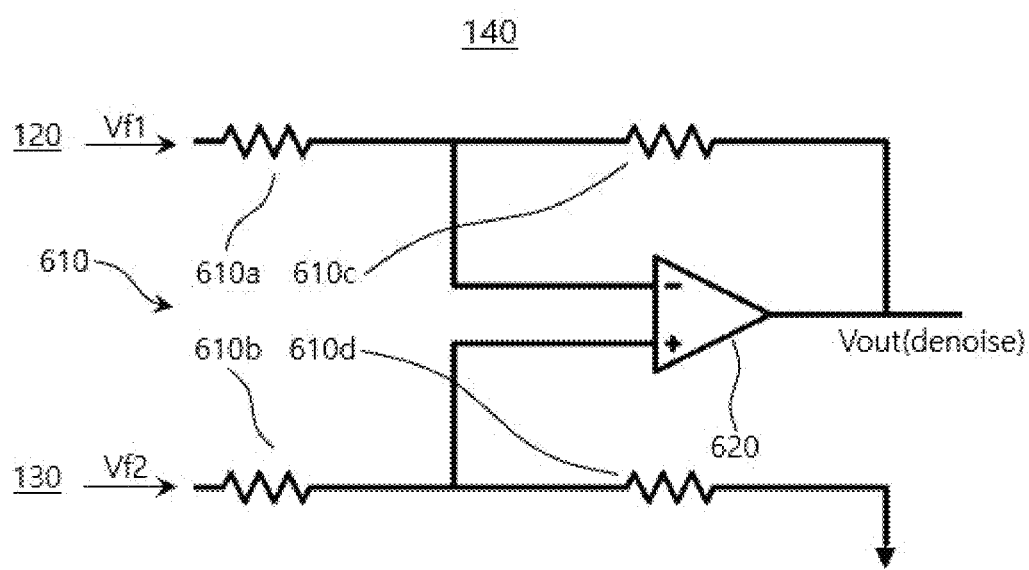
FIG. 7 is a view illustrating a timing noise removal unit of FIG. 2.

FIG. 7 shows a circuit diagram according to an embodiment of the timing noise removal unit of FIG. 2.

Referring to FIG. 7, the timing noise removal unit 140 may be configured as a difference amplifier 620 receiving the partial discharge detection signal Vf2 as a first input, receiving the partial discharge comparison signal Vf1 as a second input, and subtracting the second input from the first input. In an embodiment, the timing noise removal unit 140 may function as a subtractor that amplifies a difference between the input intensities of both input terminals to a voltage gain 1 using an operational amplifier, and in another embodiment, the timing noise removal unit 140 may function as a differential amplifier that amplifies a difference between the input intensities of both input terminals to a voltage gain greater than 1 or less than 1 using an operational amplifier.

In an embodiment, the timing noise removal unit 140 may receive the partial discharge detection signal and the partial discharge comparison signal through the plurality of resistors 610 and may include, for example, a first resistor 610a disposed between the output terminal of the second AGC 130 and the first input terminal of the difference amplifier 620 to transfer the first partial discharge detection signal Vf1, a second resistor 610b disposed between the output terminal of the second AGC 130 and the second input terminal of the difference amplifier 620 to transfer the second partial discharge detection signal Vf2, a third resistor 610c disposed between the first input terminal and the output terminal of the difference amplifier 620 to provide feedback, and a fourth resistor 610d disposed between the second input terminal of the difference amplifier 620 and the ground. In an embodiment, the plurality of resistors 610 may be designed to have the same resistance value within a resistance range of several kohms.

The timing noise removal unit 140 generates a noise removal signal from which partial discharge noise is removed based on the partial discharge detection signal and the partial discharge comparison signal. For example, the timing noise removal unit 140 may generate a noise removal signal by performing filtering on two input signals based on a reference voltage, and buffer or amplify or subtract only some of the partial discharge detection signal and the partial discharge comparison signal based on the reference voltage to generate a noise removal signal.

The timing noise removal unit 140 may remove components other than the partial discharge as noise by erasing a difference between the partial discharge detection signal and the partial discharge comparison signal or summing similar portions. In an embodiment, the timing noise removal unit 140 may compare the difference between the partial discharge detection signal Vf1 and the partial discharge comparison signal Vf2, determine and erase the similar portion as noise, and obtain a remaining portion to generate a noise removal signal Vout (denoise) (refer to the graph of FIG. 8).

In an embodiment, the timing noise removing unit 140 may be implemented through a difference amplifier that calculates a difference between the partial discharge detection signal and the partial discharge comparison signal or implemented as a differential amplifier that differentially amplifies between the partial discharge detection signal and the partial discharge comparison signal. For example, the timing noise removal unit 140 may be implemented as a difference amplifier generating the noise removal signal by subtracting the partial discharge comparison signal from the partial discharge detection signal to generate the nose removal signal and using a +5 Vdc single power supply as an operating power, or may be implemented as a differential amplifier that generates a noise removal signal by differentially amplifying a difference between the partial discharge detection signal and the partial discharge comparison signal based on a reference voltage or a certain specific voltage.

In an embodiment, the timing noise removing unit 140 may erase a difference signal through a subtraction operation between the partial discharge detection signal and the partial discharge comparison signal, and restore the original signal from the erased signal through a reverse process of the proportional signal generation process to generate the noise removal signal. For example, the timing noise removal unit 140 may erase the partial discharge comparison signal Vf2 from the partial discharge detection signal Vf1 and then modulate a log value of the corresponding signal to generate the noise removal signal Vout.

In another embodiment, the timing noise removal unit 140 may determine and acquire the difference between the partial discharge detection signal and the partial discharge comparison signal as partial discharge timing noise, and may erase the corresponding difference portion from input signals distributed to have the same amplitude through the second signal distribution module 112 from the input signal to generate a timing noise removal signal.

The timing noise removal unit 140 may further include a timing noise removal module (not shown) that removes a signal output with a strength smaller than a specific reference voltage among output signals to further remove timing noise. For example, the timing noise removal unit 140 may generate the timing noise removal signal from which a timing noise component is additionally removed by dropping the voltage raised due to the occurrence of the partial discharge to a certain specific voltage, a reference voltage or below the reference voltage.

The timing noise removal unit 140 may determine the specific reference voltage for additional removal of timing noise through manual setting by a user or automatic setting through internal feedback.

In an embodiment, the timing noise removing unit 140 may perform manual setting based on a local analog voltage according to a variable resistor manually changed by a user locally, a remote analog voltage provided remotely, or an output of a DAC by transmission of remote digital data provided remotely. For example, the timing noise removing unit 140 may include an input unit for receiving a variable resistance input by a user, and when a variable resistance value is designated locally by the user, the timing noise removing unit 140 may determine an analog voltage generated by setting a variable resistance with a corresponding designated variable resistance value as the specific reference voltage. For another example, the timing noise removal unit 140 may receive a variable resistance value designated by the corresponding user from an external partial discharge processing server (not shown) connected remotely or a partial discharge processing terminal (not shown) through the controller 500.

In another embodiment, the timing noise removal unit 140 may include a low pass filter (not shown) and a feedback module (not shown). Here, a low-pass filter is placed at the output terminal to filter the timing noise removal signal, and the feedback module detects the lowest value, average value, or highest value of the filtered timing noise removal signal through ADC conversion and digital operation and feeds it back to the controller 500 to automatically set the specific reference voltage until the corresponding detection value converges within the specific reference range. For example, when the timing noise removal signal is generated, the timing noise removal unit 140 filters the remaining signal except for a specific frequency region set by the user in association with a low frequency present in the timing noise removal signal through the low pass filter disposed at the output terminal, and repeats the ADC conversion and the digital operation process until the average value of the filtered timing noise removal signal is identified within a preset reference average value, to be fed back to the controller 230 so that the specific reference voltage is automatically set during the process.

When the timing noise removal signal is equal to or higher than the reference amplitude, the timing pulse generating unit 150 may recognize the timing noise removal signal as a partial discharge occurrence timing pulse and generate a separate partial discharge notification signal or partial discharge occurrence timing pulse converted to a transistor logic (TTL) level, and in an embodiment, generate a partial discharge notification signal to have a specific amplitude and duration. Here, the reference amplitude may be set by a designer based on design targets related to accuracy and speed, and design values of internal components may be adjusted to have the reference amplitude.

In an embodiment, the timing pulse generating unit 150 may further generate a partial discharge occurrence timing pulse signal by converting a partial discharge signal acquired from a difference amplifier or a differential amplifier into a transistor logic (TTL) pulse using a Schmitt trigger circuit.

In an embodiment, TTL pulsing may be further implemented using a comparator or through analog-to-digital conversion. More specifically, the timing pulse generating unit 150 may acquire a partial discharge occurrence timing pulse through the generated partial discharge occurrence timing pulse signal.

In an embodiment, the timing pulse generating unit 150 may be implemented by including at least one of a comparator and a Schmitt-trigger to perform conversion to a TTL level.

For example, the timing pulse generating unit 150 may be implemented to include a combination of at least one of a comparator generating a specific voltage level indicating data 1 (high) for a specific duration (e.g., in units of clocks) when the amplitude difference between the partial discharge detection signal and the partial discharge comparison signal is greater than or equal to a specific reference voltage Vt, a level trigger or an edge trigger trigging whether an output from the corresponding comparator indicates data 1 (high), and a level shifter for adjusting a voltage level. Accordingly, the timing pulse generating unit 150 may provide a TTL level partial discharge notification signal for digital signal processing to be used as a pulse signal input for digital processing in a later step.

In an embodiment, the partial discharge occurrence timing pulse acquiring unit 100 may further include a network communication module 5, and when a partial discharge notification signal is generated, the partial discharge occurrence timing pulse acquiring unit 100 may output a warning sound and transmit a notification message regarding the corresponding occurrence and information on a corresponding waveform to a partial discharge processing server or a partial discharge processing terminal connected via a network through the network communication module 5. In addition, the partial discharge occurrence timing pulse acquiring unit 100 may also be utilized as facility remote monitoring and remote prevention diagnosis equipment that monitors a change in partial discharge intensity through analysis according to strength for each time period by measuring strength of the partial discharge timing signal using the ADC-converted digital signal.

FIG. 8 is a view illustrating a process of acquiring a partial discharge occurrence timing pulse of a broadband lossless partial discharge detection and noise removal device according to an embodiment of the present disclosure.

FIG. 8 illustrates voltage waveforms input or output in the process of removing timing noise, acquiring a partial discharge occurrence timing pulse, and regenerating or producing a partial discharge signal in the process of generating a partial discharge occurrence timing pulse and generating an output signal of a synchronization comparing unit.

In FIG. 8, the partial discharge occurrence timing pulse acquiring unit 100 may receive an input signal, and the proportional signal generating unit 110 may generate a first proportional signal V1 and a second proportional signal V2 proportional to strength of the input signal Vin (for example, demodulating a log value of Vin). For example, among the RF burst signals demodulated to a log value by the proportional signal generating unit 110, a portion corresponding to the partial discharge signal may be output as proportional signals V1 and V2 having a waveform close to a very narrow waveform width (e.g., an impulse) and noises other than partial discharge may be output as proportional signals V1 and V2 having relatively smooth waveforms.

As described above, the proportional signal generating unit 110 may generate the first and second transfer function signals V1' and V2' respectively correspond to the first and second proportional signals V1 and V2 according to the set reference voltage Vref and the slope (e.g., slope=(VO2−VO1)/(PI2−PI1)) characteristics of the transfer function. Here, PI is the strength of the RF burst input shown in the process of generating the corresponding transfer function signal.

The first AGC 120 performs automatic gain control on the input first transfer function signal V1', and modifies the partial discharge detection signal Vf1 output during the automatic gain control process into a partial discharge loop filter signal Vf1' through the partial discharge feedback module 124 configured as an RC parallel circuit, and transfers the partial discharge loop filter signal Vf1' to the feedback terminal of the AGC module 122, thereby performing feedback for the series of partial discharge detection to output the partial discharge detection signal Vf1. The first AGC 120 feeds back the automatic gain control feedback signal Vf1' acquired by temporarily dropping the voltage in the high frequency band from the partial discharge detection signal to the AGC module 122 through the partial discharge feedback module 124, and increases a voltage gain through the AGC module 122 according to the corresponding feedback to over amplify the amplitude of the partial discharge detection signal Vf1 output while the corresponding drop continues, compared to the original signal.

In FIG. 8, when the partial discharge signal is included in the input signal Vin, a modified partial discharge detection signal Vf1 compared to the first transfer function signal may be generated, and when the partial discharge-like noise or communication noise is included in the input signal Vin, the partial discharge comparison signal Vf2 which is not actually modified may be generated. In the above, for convenience, the partial discharge detection signal Vf1 and the automatic gain control feedback signal Vf1' are shown separately, but may also be expressed as substantially the same node voltages depending on the implemented embodiment or parasitic elements in layout arrangement design.

The timing noise removal unit 140 may remove the partial discharge timing noise based on the difference between the partial discharge detection signal Vf1 and the partial discharge comparison signal Vf2 and output the timing noise removal signal Vout (denoise). The timing noise removal unit 140 may remove components other than the partial discharge as timing noise by erasing a difference portion between the partial discharge detection signal Vf1 and the partial discharge comparison signal Vf2 or summing similar portions. In an embodiment, the timing noise removal unit 140 may generate a partial discharge timing signal after erasing the difference between the partial discharge detection signal Vf1 and the partial discharge comparison signal Vf2 through a subtraction operation, detects only the partial discharge using the same, and reproduce the original signal or produce a partial discharge signal similar to the original signal through a reverse process of the proportional signal generating process to generate a pure partial discharge signal Vout (denoise) without partial discharge noise.

The timing noise removal unit 140 may complete the noise removal signal Vout (denoise) by removing a signal output with an intensity smaller than a specific reference voltage among output signals in order to further reduce some remaining noise components.

The timing pulse generating unit 150 may generate a TTL level partial discharge notification signal Vout (timing) when a difference between the partial discharge detection signal and the partial discharge comparison signal is equal to or greater than Vt. Vt is a reference voltage applied to a comparator (not shown), and a positive TTL signal is generated when the difference between the partial discharge detection signal and the partial discharge comparison signal is greater than Vt, and a potential 0 is output when the difference between the partial discharge detection signal and the partial discharge comparison signal is less than Vt.

According to the above embodiments, the partial discharge occurrence timing pulse acquiring unit 100 may selectively perform feedback according to whether or not the partial discharge signal is included in the input signal, to generate a differential timing noise removal signal. When it is determined that the discharge signal is included, a partial discharge notification signal may be generated to inform thereof.

Figure 9:
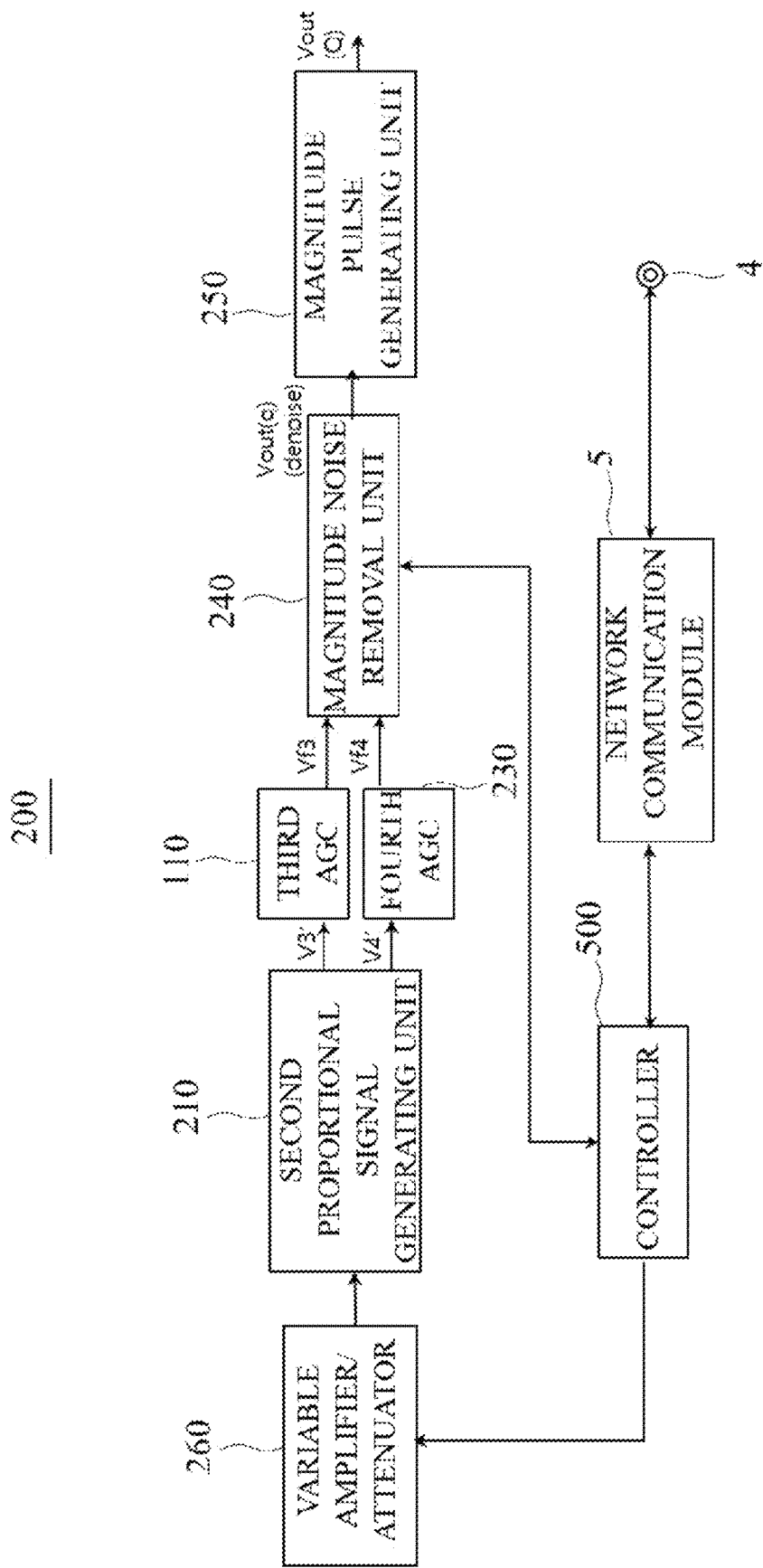
FIG. 9 is a view illustrating a partial discharge magnitude pulse acquiring unit of FIG. 1.

FIG. 9 is a view illustrating a partial discharge magnitude pulse acquiring unit of FIG. 1.

Referring to FIG. 9, the partial discharge magnitude pulse acquiring unit 200 may include a communication port 4, a network communication module 5, a variable amplifier/variable attenuator 260, a second proportional signal generating unit 210, a third AGC 220, a fourth AGC 230, a magnitude noise removal unit 240, a magnitude pulse generating unit 250, and a controller 500.

The second proportional signal generating unit 210 generates third and fourth proportional signals according to the input signal. More specifically, the proportional signal generating unit 210 may be electrically connected to the variable amplifier/attenuator 260 at the input terminal and may receive an input signal through the variable amplifier/variable attenuator 260, generate third and fourth proportional signals based on the received input signal, and electrically connected to the input terminal of the third and fourth AGCs 220 and 230 at the output terminal to provide the generated third and fourth proportional signals to the input terminal of the third and fourth AGCs 220 and 230.

In an embodiment, the proportional signal generating unit 210 may generate third and fourth proportional signals proportional to the intensity of at least one of the amplitude, frequency, and power of the input signal. For example, when the input signal is received, the proportional signal generating unit 210 may generate proportional signals V3' and V4' as DC output voltages proportional to the power appearing at the corresponding input terminal (refer to the graph of FIG. 13). The magnitude pulse generating unit 250 outputs Vout(Q) by performing voltage buffering or line output stabilization for Vout(q) (denoise). These contents will be described in more detail with reference to FIG. 10.

Figure 10:
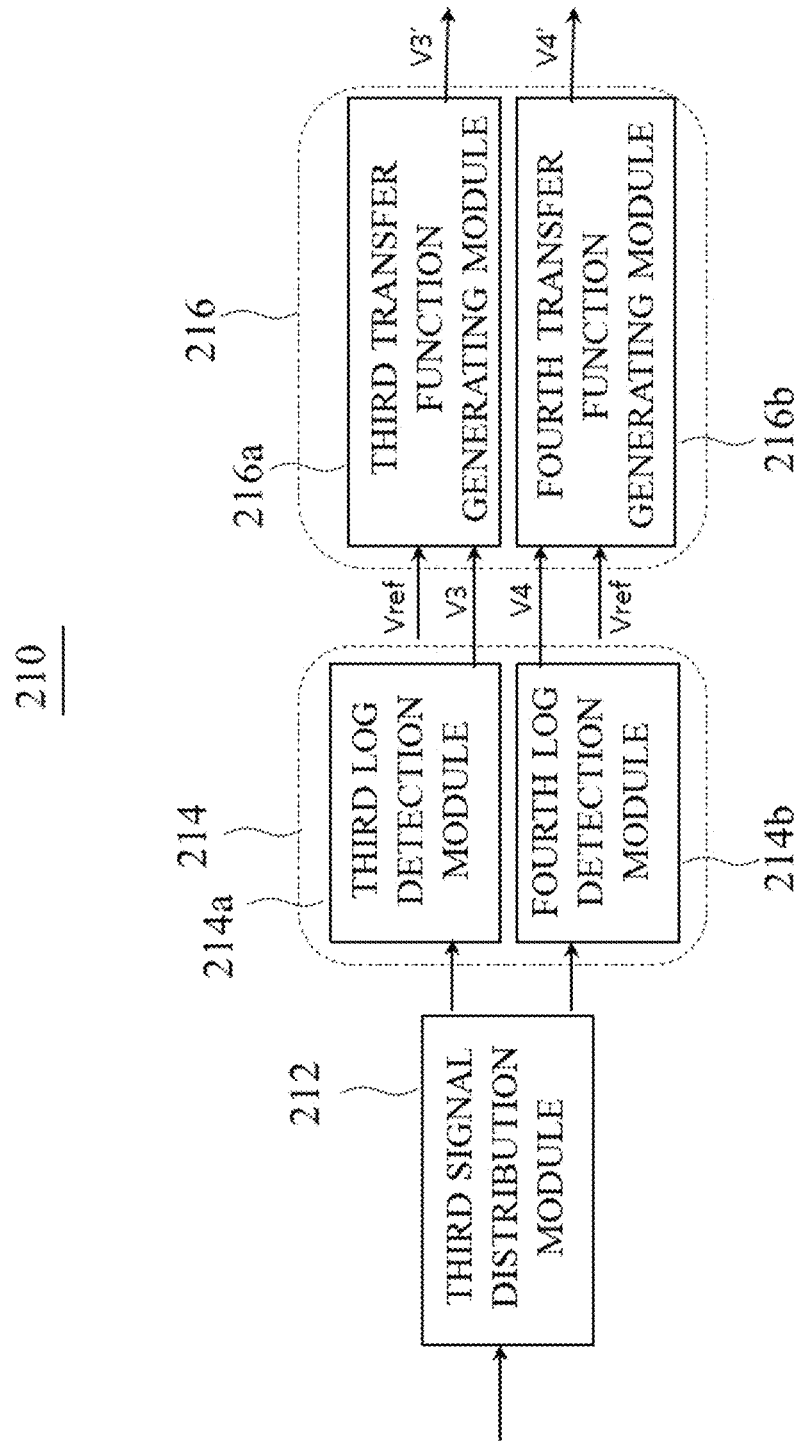
FIG. 10 is a view illustrating a second proportional signal generating unit of FIG. 9.

FIG. 10 is a view illustrating a second proportional signal generating unit of FIG. 9.

Referring to FIG. 10, the second proportional signal generating unit 210 may include a third signal distribution module 212, third and fourth log detection modules 214, and third and fourth transfer function generating modules 216.

The third signal distribution module 212 may distribute at least two input signals, and in an embodiment, generate at least two signals having the same phase and amplitude as the corresponding signal based on the input signal. The third signal distribution module 212 may be electrically connected to the input terminals of the third and fourth log detection modules 214 at the output terminal, generate two output signals having the same phase and amplitude through the third signal distribution module 212 from the input signal received through the variable amplifier/variable attenuator 260, and provide the two output signals to the third log detection module 214a and the fourth log detection module 214b, respectively.

In an embodiment, the third signal distribution module 212 may be implemented by including an amplifier (not shown) that amplifies an input signal with a predetermined specific power gain (e.g., 10 dB), distribute the signal amplified through the corresponding amplifier as a plurality of signals, and may be implemented as a 1:N (N is a natural number greater than or equal to 2) divider.

The third signal distribution module 212 may generate third and fourth proportional signals proportional to a size of at least one of the amplitude, frequency, and power of the input signal. In an embodiment, the third and fourth log detection modules 214 may correspond to the number of signal distributions of the third signal distribution module 212. For example, when the third signal distribution module 212 is implemented as a 1:3 divider, it may include third to fourth log detection modules. The third log detection module 214a may receive one signal distributed from the third signal distribution module 212, and the fourth log detection module 214b may receive another signal distributed from the third signal distribution module 212, and each of the third and fourth log detection modules 214 may generate third and fourth proportional signals V3 and V4 as a DC output voltage proportional to signal power appearing at the corresponding input terminal, respectively.

In an embodiment, each of the third and fourth log detection modules 214 may be implemented as a log detector generating an output signal by demodulating a log value of an input signal. Here, the log detector generically refers to cases expressed as a log detector, a log amp, a log amplifier, a logarithmic amplifier, an RF power detector, a log amplifier detector, and the like. In this case, a measured value of a total node power at the RF input port may represent a total power to be converted into DC including signal, noise, and interference.

In another embodiment, each of the third and fourth log detection modules 214 is via at least one of an amplifier, an envelope detector, a diode detector, and an integrator, or at least It may be implemented through a combination of the two, for example, through a combination of an RF amplifier and an envelope detector or through a combination of an amplifier and an integrator.

Each of the third and fourth transfer function generating modules 216 may output a transfer function signal by converting a proportional signal input to an input terminal based on a reference voltage and a transfer function. The third transfer function generating module 216a receives the third proportional signal V3 from the third log detection module 214a and generates the first transfer function signal V3' based on the reference voltage Vref and the transfer function to generate a third automatic gain. The fourth transfer function generating module 216b receives the fourth proportional signal V4 from the fourth log detection module 214b and uses the same reference voltage Vref and the same transfer function as the base voltage. A fourth transfer function signal V4' may be generated and outputted to an input terminal of the fourth AGC 230.

Each of the third and fourth transfer function generating modules 216 may be provided with a reference voltage Vref having a specific DC voltage level, and output the input/output signals through a transfer function representing linear characteristics of the input/output signals. At least one of a range, a voltage characteristic of an output signal versus an input signal, and a frequency characteristic may be defined. Here, the transfer function may be designed by a designer or a user, and the input value and range of the reference voltage may be adjusted by the user.

Figure 11:
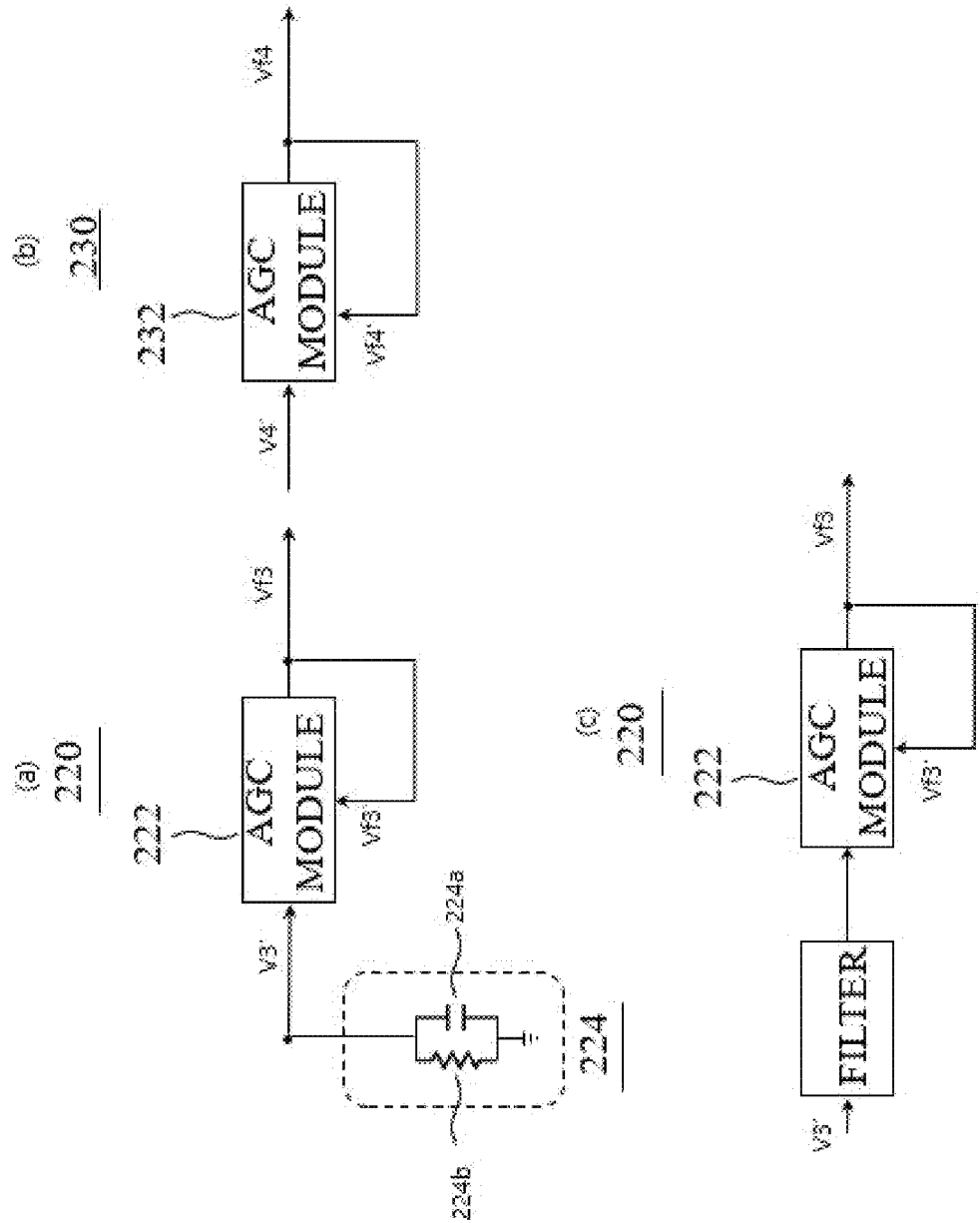
FIG. 11 is a view illustrating third and fourth AGCs of FIG. 9.

In an embodiment, the third log detection module 214a and the first transfer function generating module 216a of FIG. 10 and the AGC module 222 of FIG. 11 may be replaced with a third commercial log amplifier, in particular, may be replaced with a third commercial log amplifier having an output log value as a negative slope, and a partial discharge loop filter module 224 may be disposed between the loop filter input port and the log amp output port which may control the output frequency bandwidth of the log amplifier. The fourth log detection module 214b, the fourth transfer function generating module 216b, and the AGC module 232 may be replaced with a fourth commercial log amplifier, the third commercial log amplifier and the fourth commercial log amplifier may be products having the same characteristics. In addition, the first, second, third, and fourth commercial log amplifiers may be products having the same or substantially the same characteristics.

FIG. 11 is a view illustrating third and fourth AGCs of FIG. 9.

More specifically, FIG. 11(a) shows the third AGC 220, and FIG. 11(b) shows the fourth AGC 230.

Referring to FIG. 11(a), the third AGC 220 may include an AGC module 222 and a partial discharge loop filter module 224.

The AGC module 222 may perform automatic gain control on the input signal, and in an embodiment, the AGC module 222 may be implemented as an auto gain control (AGC) or an automatic volume control (AVC) which is a closed loop feedback control circuit that provides controlled signal amplitude based on an amplitude change of a signal fed back at the output despite a change in amplitude of the input signal. The AGC module 222 may reduce the gain to reduce the volume of the output signal when the strength of the input signal is strong, and increase the gain to increase the volume of the output signal when the strength of the input signal is weak, and may dynamically control an input/output gain based on an average signal level or a maximum output signal level of the gain control feedback signal.

The partial discharge loop filter module 224 may be connected to an input terminal of the AGC module 222, and may process an input signal of the AGC module 222 and input the processed signal to the input terminal. The partial discharge loop filter module 224 may further include at least one partial discharge capacitor 224a and/or at least one partial discharge resistor 224b each connected at one end of the input terminal of the AGC module 222.

In an embodiment, when the partial discharge signal component is reflected in the input partial discharge detection signal, the partial discharge loop filter module 224 may change an output frequency bandwidth due to a filter action between the partial discharge capacitor and the partial discharge resistor 224b 224a including an RC parallel circuit.

At this time, in an embodiment, the partial discharge capacitor 224a may be designed to have a capacitance value of 1 nF to 10 uF, but may include some or all according to the designer's intention, peripheral circuit component characteristics, circuit configuration, PCB material, and pattern characteristics. The partial discharge resistor 224b may be designed to have a value of several kohms to hundreds of kohms depending on the capacitor design range of the partial discharge capacitor 224a, for example, may be designed to have a resistance value of 20 kOhm to 40 kOhm, and a device value may be adjusted and varied by considering a pattern length, pattern width, and dielectric constant of a material in the design of the PCB pattern.

In the above, exemplary configurations for implementing the partial discharge loop filter module 224 have been described, but the present disclosure is not limited thereto, and for partial discharge detection, the input signal of the AGC module 222 may be modified to be configured in various required forms in relation to a function of suppressing a high frequency component of a waveform in the occurrence of partial discharge or noise to reduce a frequency bandwidth.

The fourth AGC 230 performs automatic gain control based on the partial discharge comparison signal generated based on the fourth proportional signal and fed back to an input terminal.

Referring to FIG. 11(b), the fourth AGC 230 may include the AGC module 222. In an embodiment, when the fourth proportional signal or the fourth transfer function signal is received, the third AGC 230 may perform automatic gain control on the input received through the AGC module 222 and feeds back an output signal to the feedback terminal among the input terminal to generate a partial discharge comparison signal.

For example, the fourth AGC 230 may output the partial discharge comparison signal Vf4 which is not modified compared to the fourth proportional signal (or the fourth transfer function signal V4') or which is modified to be less than the reference range through a series of processes of generating the partial discharge detection signal Vf4 by performing AGC on the fourth proportional signal (or the fourth transfer function signal V4') received regardless of whether the partial discharge signal is included or not and feeding back the partial discharge detection signal generated in the process of AGC to the feedback terminal. As a result, the partial discharge detection signal Vf3 generated by the third AGC 220 and the partial discharge comparison signal Vf4 generated by the fourth AGC 230 may be output as analog signals having different values depending on whether the partial discharge signal is included in the input signal.

The magnitude noise removal unit 240 generates a noise removal signal from which partial discharge noise is removed based on a comparison signal having a narrow frequency bandwidth compared to the original signal and a comparison target signal having a frequency bandwidth unchanged compared to the original signal. For example, the magnitude noise removal unit 240 may generate a noise removal signal by performing filtering on the input signals based on the reference voltage, and generate a noise removal signal by buffering, amplifying, or subtracting only a portion of the comparison signal and the comparison target signal based on a reference voltage.

The magnitude noise removal unit 240 may remove components other than the partial discharge as noise by erasing a difference between the comparison signal having a narrower frequency bandwidth than the original signal and the comparison target signal having a frequency bandwidth unchanged compared to the original signal, or summing up similar portions. In an embodiment, the magnitude noise removal unit 240 may compare the difference between the comparison signal Vf3 having a modulated frequency bandwidth and the comparison target signal Vf4 having unmodulated frequency bandwidth, determine the similar portions as noise and remove the same, and acquire the remaining portion to generate a noise removal signal Vout (Q) (refer to the graph of FIG. 13).

In an embodiment, the magnitude noise removal unit 240 may be implemented through a difference amplifier that calculates a difference between the comparison signal Vf3 having a modulated frequency bandwidth and the comparison target signal Vf4 having unmodulated frequency bandwidth or as a differential amplifier that differentially amplifies between the partial discharge detection signal and the partial discharge comparison signal. For example, in order to generate the magnitude noise removal signal, the magnitude noise removal unit 240 may be implemented as a difference amplifier that subtracts the partial discharge comparison signal from the partial discharge detection signal to generate the magnitude noise removal signal and uses a +5 Vdc single power supply as an operating power source or may be implemented as a differential amplifier that generates a magnitude noise removal signal by differentially amplifying the difference therebetween based on the reference voltage or a certain specific voltage.

In an embodiment, the magnitude noise removal unit 240 may generate a noise removal signal by erasing a difference signal through a subtraction operation between the comparison signal Vf3 having a modulated frequency bandwidth and the comparison target signal Vf4 having unmodulated frequency bandwidth. In the above embodiment, the comparison signal and the comparison target signal may be interchanged with each other depending on a circuit configuration and designer's intention.

The magnitude noise removal unit 240 may further include a magnitude noise removal module (not shown) that removes a signal output with a strength smaller than a specific reference voltage from among output signals to further remove magnitude noise. The magnitude noise removal unit 240 may further include a magnitude noise removal module (not shown) that removes a signal output with a strength smaller than a specific reference voltage among output signals to further remove magnitude noise. For example, the magnitude noise removal unit 240 may generate the magnitude noise removal signal from which a magnitude noise component is additionally removed by dropping the voltage raised due to the occurrence of the partial discharge to a certain specific voltage, a reference voltage or below the reference voltage. In an embodiment, the magnitude noise removal unit 240 may determine the specific reference voltage for additional removal of magnitude noise through manual setting by a user or automatic setting through internal feedback.

In an embodiment, the magnitude noise removing unit 240 may perform manual setting based on a local analog voltage according to a variable resistor manually changed by a user locally, a remote analog voltage provided remotely, or an output of a DAC by transmission of remote digital data provided remotely. For example, the magnitude noise removing unit 240 may include an input unit for receiving a variable resistance input by a user, and when a variable resistance value is designated locally by the user, the magnitude noise removing unit 240 may determine an analog voltage generated by setting a variable resistance with a corresponding designated variable resistance value as the specific reference voltage. For another example, the magnitude noise removal unit 240 may receive a variable resistance value designated by the corresponding user from an external partial discharge processing server (not shown) connected remotely or a partial discharge processing terminal (not shown) through a network communication module embedded in the partial discharge magnitude pulse acquiring unit 200.

In an embodiment, the partial discharge magnitude pulse acquiring unit 200 may further include a network communication module 5, and when a partial discharge notification signal is generated, the partial discharge magnitude pulse acquiring unit 200 may output a warning sound and transmit a notification message regarding the corresponding occurrence and information on a corresponding waveform to a partial discharge processing server or a partial discharge processing terminal connected via a network through the network communication module 5. In addition, the partial discharge magnitude pulse acquiring unit 200 may also be utilized as facility remote monitoring and remote prevention diagnosis equipment that monitors a change in partial discharge intensity through analysis according to strength for each time period by measuring strength of the partial discharge magnitude signal using the ADC-converted digital signal.

Figure 12:
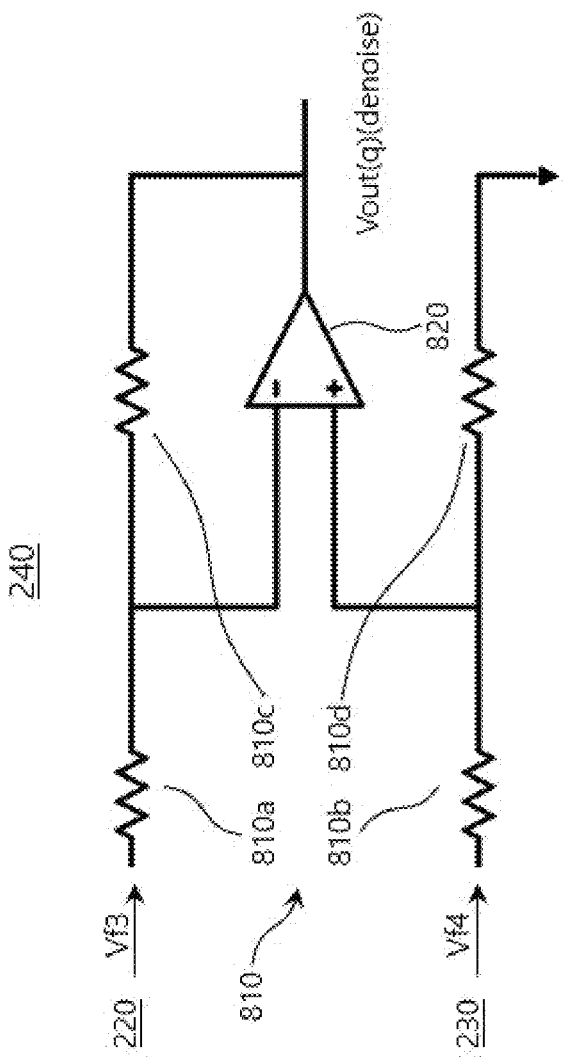
FIG. 12 is a view illustrating a magnitude noise removal unit of FIG. 9.

FIG. 12 is a view illustrating a magnitude noise removal unit of FIG. 9.

Referring to FIG. 12, the magnitude noise removal unit 240 may be configured as a difference amplifier 820 receiving the partial discharge detection signal Vf3 as a first input, receiving the partial discharge comparison signal Vf4 as a second input, and subtracting the second input from the first input. In an embodiment, the magnitude noise removal unit 240 may function as a subtractor that amplifies a difference between the input intensities of both input terminals to a voltage gain 1 using an operational amplifier, and in another embodiment, the timing noise removal unit 140 may function as a differential amplifier that amplifies a difference between the input intensities of both input terminals to a voltage gain greater than 1 or less than 1 using an operational amplifier.

In an embodiment, the magnitude noise removal unit 240 may receive the partial discharge detection signal and the partial discharge comparison signal through the plurality of resistors 810 and may include, for example, a first resistor 810*a* disposed between the output terminal of the third AGC 220 and the first input terminal of the difference amplifier 820 to transfer the third partial discharge detection signal Vf3, a second resistor 810*b* disposed between the output terminal of the fourth AGC 230 and the second input terminal of the difference amplifier 820 to transfer the fourth partial discharge detection signal Vf4, a third resistor 810*c* disposed between the first input terminal and the output terminal of the difference amplifier 820 to provide feedback, and a fourth resistor 810*d* disposed between the second input terminal of the difference amplifier 820 and the ground. In an embodiment, the plurality of resistors 810 may be designed to have the same resistance value within a resistance range of several kohms.

Figure 13:
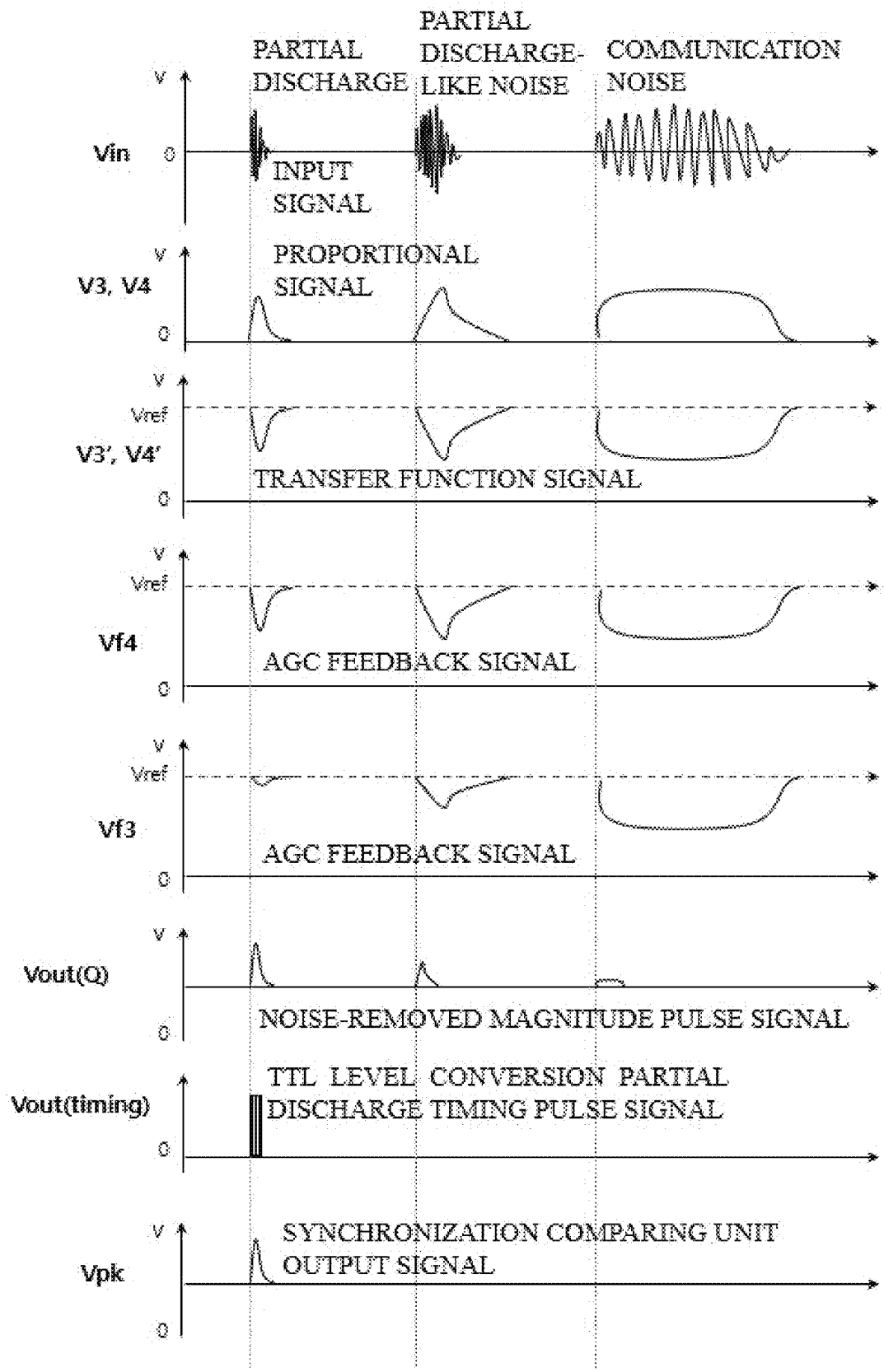
FIG. 13 is a view illustrating a partial discharge magnitude pulse acquisition process of a broadband lossless partial discharge detection and noise removal device according to an embodiment of the present disclosure.

FIG. 13 is a view illustrating a partial discharge magnitude pulse acquisition process of a broadband lossless partial discharge detection and noise removal device according to an embodiment of the present disclosure.

FIG. 13 shows voltage waveforms input or output during the process of generating a partial discharge magnitude pulse, generating an output signal of a synchronization comparing unit, removing magnitude noise, and acquiring a magnitude pulse.

In FIG. 13, the partial discharge magnitude pulse acquiring unit 200 may receive an input signal Vin through an input port, and the second proportional signal generating unit 210 may generate a third proportional signal V3 and a fourth proportional signal V4 proportional to the strength of the input signal Vin. For example, among the RF burst signals demodulated to a log value by the second proportional signal generating unit 210, a portion corresponding to the partial discharge signal may be output as proportional signals V3 and V4 having a waveform close to a very narrow waveform width (e.g., an impulse) and noises other than partial discharge may be output as proportional signals V3 and V4 having relatively smooth waveforms.

As described above, the proportional signal generating unit 111 may generate the third and fourth transfer function signals V3' and V4' respectively correspond to the third and fourth proportional signals V3 and V4 according to the set reference voltage Vref and the slope (e.g., slope=(VO2−VO1)/(PI2−PI1)) characteristics of the transfer function. Here, PI is the strength of the RF burst input shown in the process of generating the corresponding transfer function signal.

The third AGC 220 may transfer the signal V3' having a changed frequency bandwidth to the input terminal of the AGC module 222 through the partial discharge loop filter module 224 including the RC parallel circuit for the input third transfer function signal V3, perform automatic gain control thereon, and output the partial discharge detection signal Vf3 output during the automatic gain control process. The fourth AGC 230 may perform automatic gain control through the AGC module 222 according to the lossless feedback of V4' and may stably output Vf4. In FIG. 13, when the partial discharge signal is included in the input signal Vin, a modified partial discharge detection signal Vf3 compared to the third transfer function signal may be generated, and when the partial discharge-like noise or communication noise is included, the partial discharge comparison signal Vf4 which has not been actually modified may be generated.

The magnitude noise removal unit 240 may remove the partial discharge magnitude noise based on the difference between the comparison signal Vf3 whose frequency bandwidth is reduced from V3' and the same signal Vf4 as the comparison target signal whose frequency bandwidth is not changed from V3' and output the magnitude noise removal signal Vout (q) (denoise). The magnitude noise removal unit 240 may remove a component other than the partial discharge as magnitude noise by erasing the difference portion between the comparison signal Vf3 having a reduced frequency bandwidth from V4' and the same signal V4f as the original signal whose frequency bandwidth is not changed from V4' or summing similar portions. In an embodiment, the magnitude noise removal unit 240 may generate a partial discharge magnitude signal after erasing the difference portion through a subtraction operation between the comparison signal Vf3 having a frequency bandwidth reduced from V3' and the same signal Vf4 as the comparison target signal whose frequency bandwidth is not changed from V3' and output a pulse having substantially the same magnitude as the original partial discharge magnitude using the same, and meanwhile, in the case of noise, only a pulse significantly smaller than the original magnitude may be output to produce a pulse having an intact magnitude for the partial discharge signal to generate Vout(q)(denoise).

In order to further reduce some of the remaining noise pulse components, the magnitude noise removal unit 240 may remove a signal output with an intensity smaller than a specific reference voltage among output signals by connecting a forward diode to complete the noise removal signal Vout(q) (denoise). The magnitude pulse generating unit 250 outputs Vout(Q) by performing voltage buffering or line output stabilization on Vout(q) (denoise).

Figure 14:
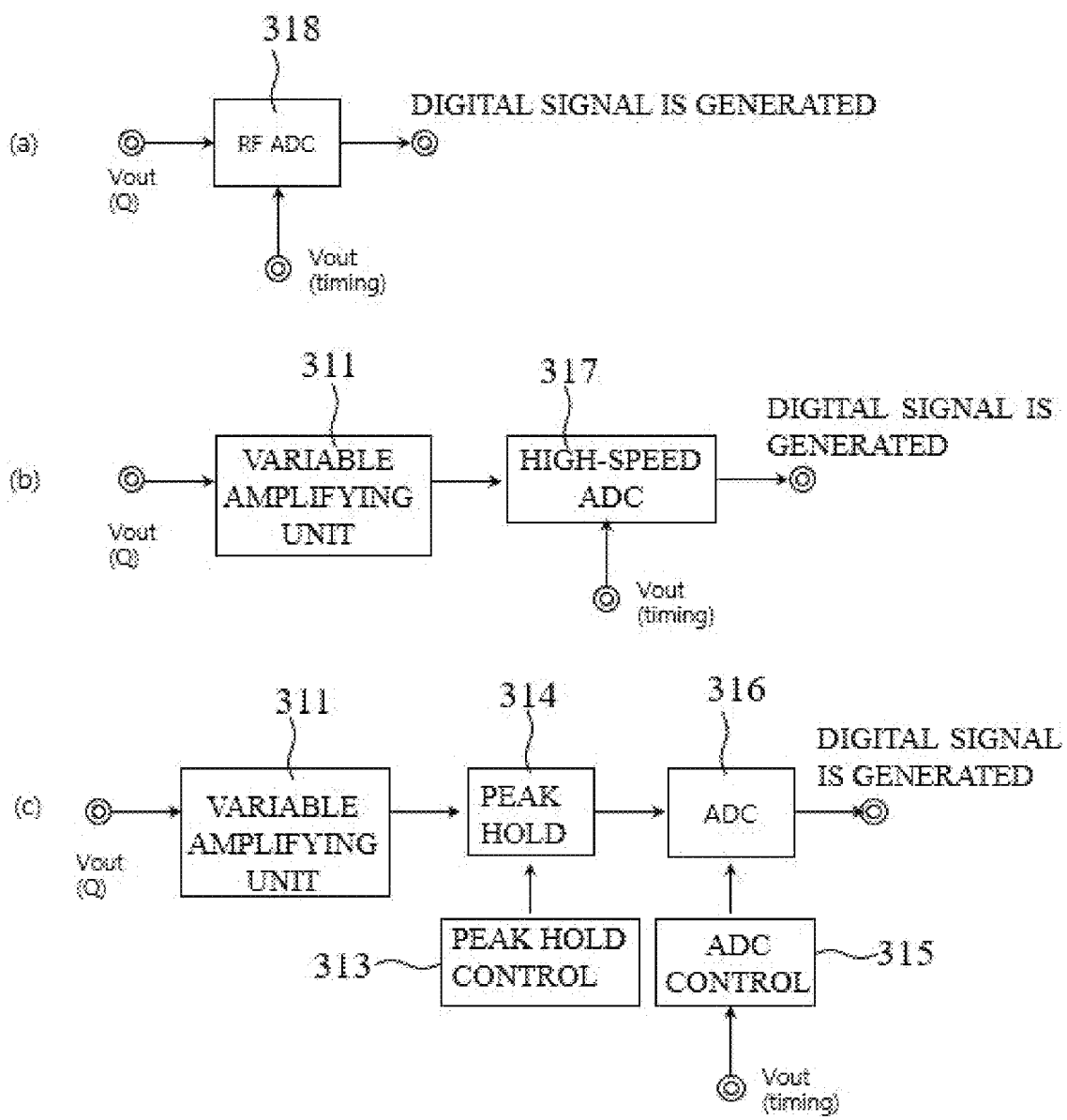
FIG. 14 is a view illustrating a synchronization comparing unit of FIG. 1.

FIG. 14 is a view illustrating an embodiment of the synchronization comparing unit of FIG. 1.

The synchronization comparing unit 300 is similar to an AND circuit in that a signal is acquired when synchronization between two pulses is met, as a concept of acquiring a magnitude pulse when generating a timing pulse. In an embodiment, the synchronization comparing unit 300 may use a combination of an ADC and a microprocessor, an AND circuit, or an analog switching circuit in implementing the above concept. FIG. 14 discloses an example of a combination of ADC and microprocessor.

In FIG. 14, the synchronization comparing unit 300 may use first, second, and third ADCs according to the speed of ADC conversion. Here, the first, second, and third ADCs may respectively correspond to an RF ADC, a high-speed ADC, and a general ADC.

In an embodiment, the general ADC may operate at a sampling speed of up to 1 Msps, the high-speed ADC may operate from 250 Msps to 1 Gsps, and the RF ADC may operate up to several Gsps.

In an embodiment, as in (a), in the case of RF ADC operation, the input RF signal is directly sampled at the RF level without any modulation process and supplied to the synchronization comparing unit 300, and the synchronization comparing unit 300 may acquire the partial discharge magnitude pulse corresponding to the magnitude noise removal signal (that is, a Vout(Q) value at the timing of partial discharge occurrence). In this case, the RF FPGA may be operated, and the partial discharge signal value may be acquired by referring to the instantaneous Vout (Q) value and the timing of occurrence.

In an embodiment, as in (b), in the case of high-speed ADC operation, a signal amplified or attenuated by the variable amplification unit controlled by the controller 500 is received and passed to the synchronization comparing unit 300 without going through a special modulation process. And the synchronization comparing unit 300 may acquire the partial discharge digital signal value at the timing of occurrence of the partial discharge.

In an embodiment, as in (c), in the case of general ADC operation, a peak hold method of amplifying or attenuating an input signal according to control of the synchronization comparing unit 300 and modulating the signal by an RF log detection module to store a maximum value in a capacitor may be used, and the peak hold value may be sampled and transmitted to the synchronization comparing unit 300 to acquire a partial discharge value, and the synchronization comparing unit 300 may reset a peak hold capacitor to prepare a next value. In this case, the peak hold period, peak hold holding time, and reset timing may be determined by the synchronization comparing unit 300. In FIG. 14, Vout (timing) may be provided to the CPU so that the CPU may trigger control the ADC timing, and in this case, the CPU may manage ADC and DAC trigger.

Figure 15:
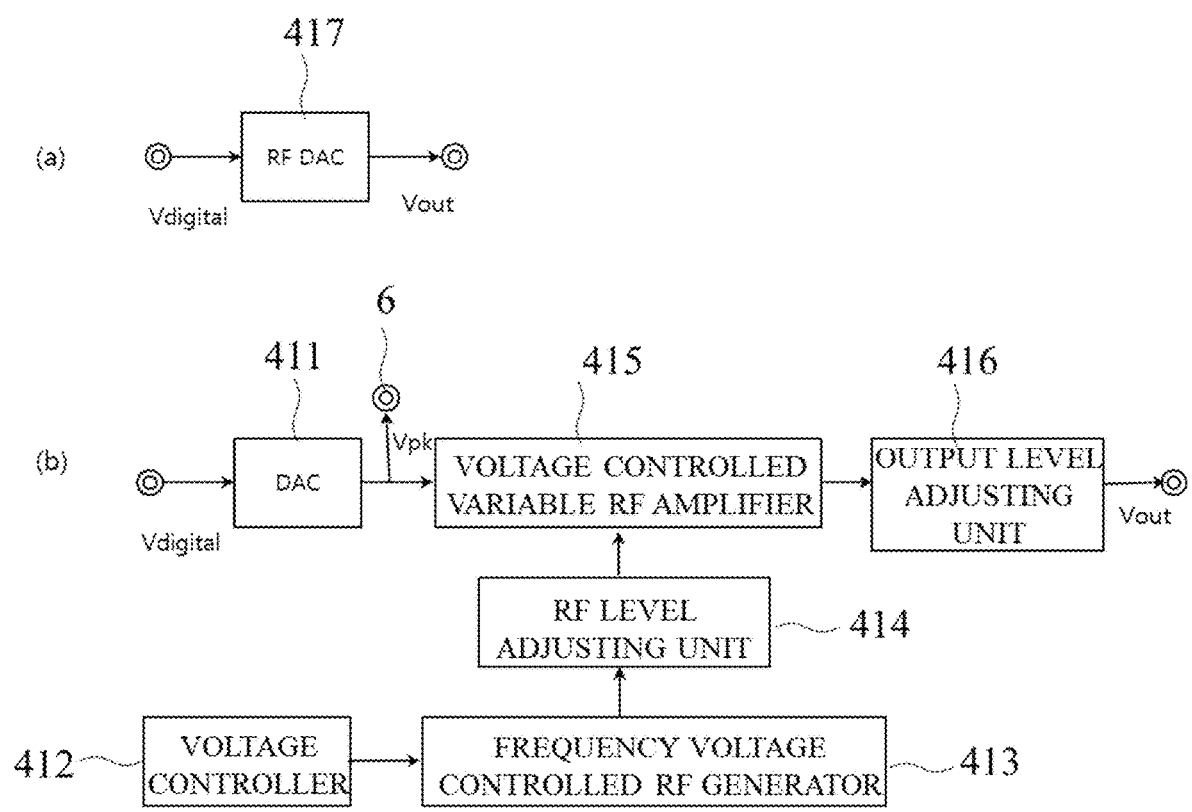
FIG. 15 is a view illustrating a partial discharge signal generating unit of FIG. 1.

FIG. 15 is a view illustrating a partial discharge signal generating unit of FIG. 1.

Referring to FIG. 15, the partial discharge signal generating unit 400 may include a voltage controller 412, a frequency voltage controlled RF generator 413, an RF level adjusting unit 414, a voltage controlled variable RF amplifier 415, an output level adjusting unit 416, a DAC 411, and an RF DAC 417.

In an embodiment, the partial discharge signal generating unit 400 may selectively operate a connection method (hereinafter referred to as topology) of a circuit configuration according to the speed of the DAC. More specifically, the partial discharge signal generating unit 400 may selectively use the first or second DAC according to the speed of the DAC. Here, the first DAC may correspond to an RF DAC as shown in (a), and the second DAC may correspond to a general DAC as shown in (b). The RF DAC may directly generate RF signals of 500 Mhz or higher even without a separate additional topology, and in this case, RF FPGA may be operated, and a high-speed RF DAC with a simplified topology including a function of direct digital synthesizer (DDS) or a software define radio (SDR) may be operated.

In an embodiment, in the case of general DAC operation, a frequency voltage controlled RF generator 413, such as a voltage control oscillator (VCO). may be operated, and in an embodiment, an RF continuous wave of 0 dBm 600 MHz may be generated, and a control voltage of this device may be controlled by a voltage supplied from the controller 500 through the voltage controller 412 or supplied alone. The generated RF signal may be supplied to the voltage-controlled variable RF amplifier 415 as a continuous wave of 600 MHz with a level of −30 dBm in an embodiment through the RF level adjusting unit 414, such as an attenuator, and the amplification degree of this device may be controlled by the voltage waveform Vpk supplied from the DAC 411 to generate an RF burst. The generated RF burst may be appropriately adjusted by the output level adjusting unit 416, such as an attenuator, and transmitted as Vout, that is, a regenerated partial discharge RF signal. Vpk is an analog signal and is a signal obtained by generating a digital signal Vdigital as an analog signal through the DAC 411.

Figure 16:
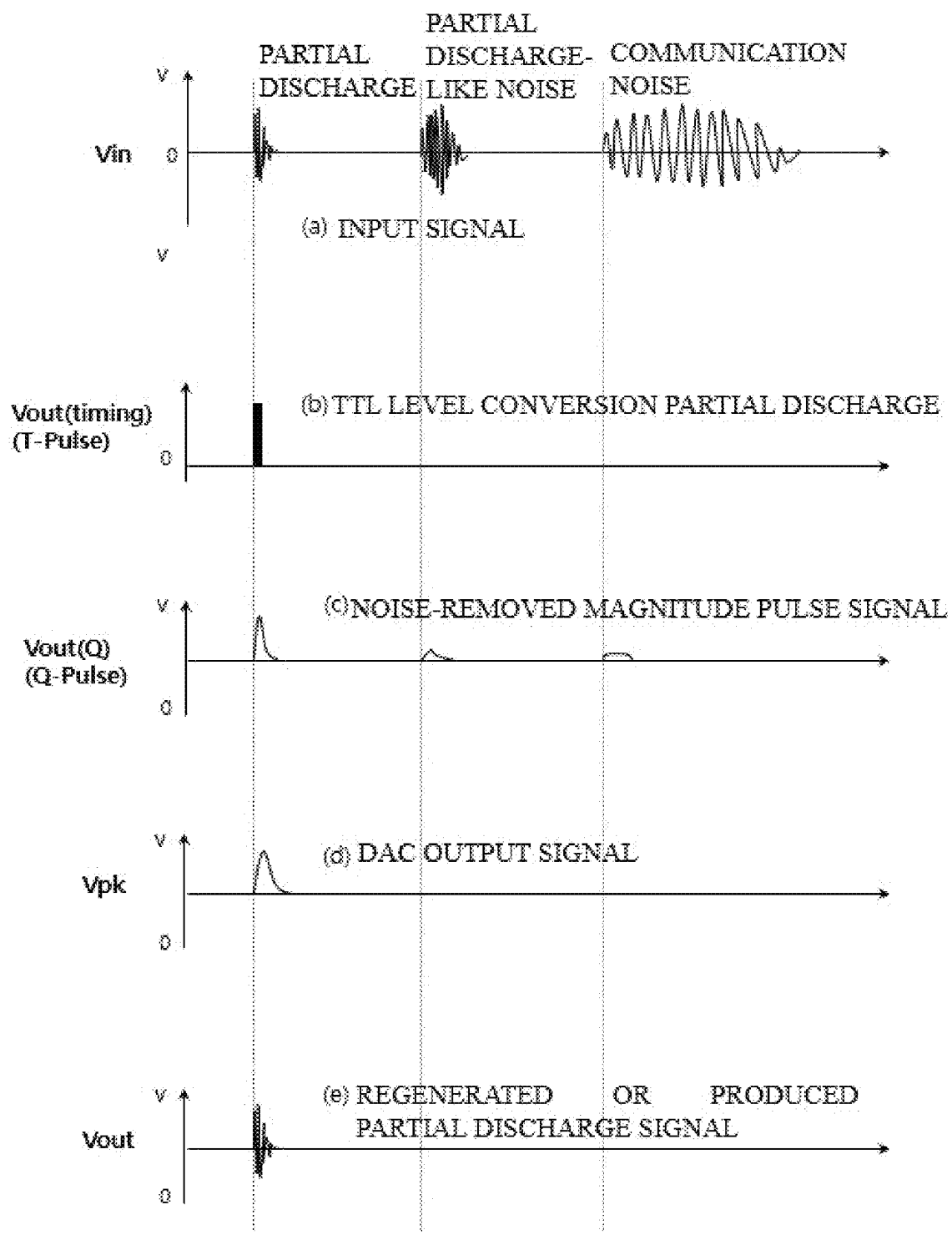
FIG. 16 is a view illustrating voltage waveforms input or output in a partial discharge occurrence timing pulse generating process, noise removal process, partial discharge signal reproducing or producing process of a broadband lossless partial discharge detection and noise removal device according to an embodiment of the present disclosure.

FIG. 16 is a view illustrating voltage waveforms input or output in a partial discharge occurrence timing pulse generating process, noise removal process, partial discharge signal reproducing or producing process of a broadband lossless partial discharge detection and noise removal device according to an embodiment of the present disclosure.

In FIG. 16, the broadband lossless partial discharge detection and noise removal device 1000 may receive an input signal Vin through an input port 1. (a) shows a case in which a partial discharge signal, a partial discharge similar signal, and communication noise are input to Vin as an example. (b) is the partial discharge timing pulse acquiring unit 100 output signal Vout (timing). Referring to Vout (timing), it can be seen that the timing pulse signal is generated at the beginning of the partial discharge signal. (c) is the output signal Vout(Q) of the partial discharge magnitude pulse acquiring unit 200. It can be seen that the partial discharge magnitude pulse has little change in magnitude in the case of the partial discharge signal, and other noise signals are significantly attenuated. (d) is the DAC 411 output signal Vpk. The output signal of the DAC 411 is output in a portion in which the Vout(timing) signal and the Vout(Q) signal overlap each other in a time domain, and the magnitude of Vout(Q) may be detected. (e) is the output signal Vout of the partial discharge signal generating unit 400. The partial discharge signal generating unit 400 may receive signals from the ADCs 316, 317 and 318, generate a Vpk signal (partial discharge pulse) through a DAC, and produce RF to regenerate the partial discharge signal.

Figure 17:
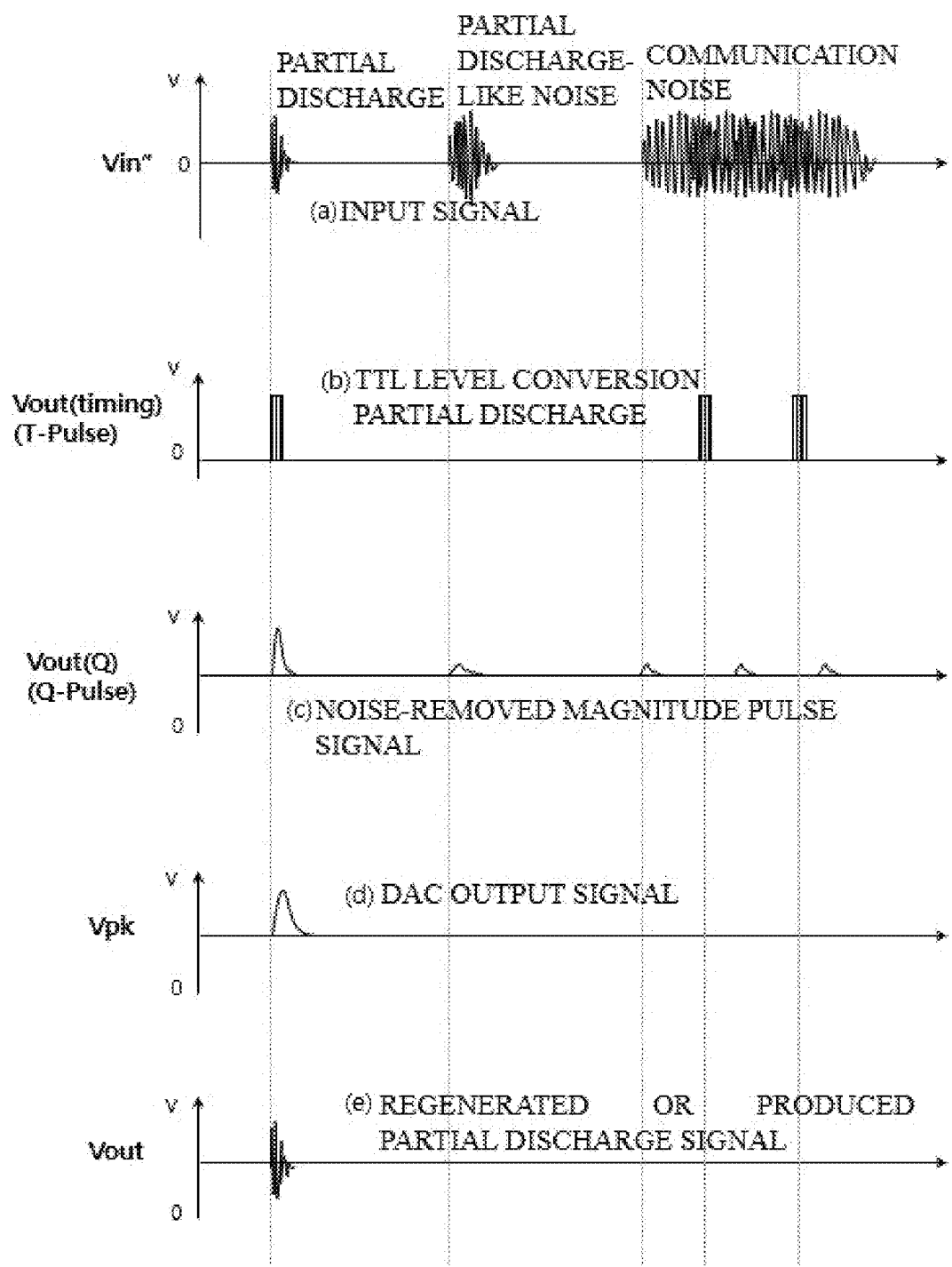
FIG. 17 is a view illustrating voltage waveforms input or output in a partial discharge occurrence timing pulse generating process, noise removal process, partial discharge signal reproducing or producing process of a broadband lossless partial discharge detection and noise removal device according to an embodiment of the present disclosure, which, in particular, illustrates a noise removal process for communication burst noise containing an internal rapid change signal that was not removed with the conventional technology as it had the same rising time as partial discharge.

FIG. 17 a view illustrating voltage waveforms input or output in a partial discharge occurrence timing pulse generating process, noise removal process, partial discharge signal reproducing or producing process of a broadband lossless partial discharge detection and noise removal device according to an embodiment of the present disclosure, which, in particular, illustrates a noise removal process for communication burst noise containing an internal rapid change signal that was not removed with the conventional technology as it had the same rising time as partial discharge. FIG. 17 illustrates a process of removing noise in a signal region having a rising time, such as partial discharge, in a communication noise, such as an LTE signal.

In FIG. 17, the broadband lossless partial discharge detection and noise removal device 1000 may receive an input signal Vin through an input port 1. (a) shows a case in which a partial discharge signal, a partial discharge similar signal, and communication noise are input to Vin as an example. (b) is the output signal Vout (timing) of the partial discharge occurrence timing pulse acquiring unit 100. Referring to Vout (timing), it can be seen that the timing pulse signal is generated at the beginning of the partial discharge signal and inside the communication noise. (c) is the partial discharge magnitude pulse acquiring unit 200 output signal Vout(Q). It can be seen that the partial discharge magnitude pulse has little change in magnitude in the case of the partial discharge signal, and other noise signals are significantly attenuated. In addition, in the case of the communication noise domain, it can be seen that the timing pulse Vout (timing) and the magnitude pulse Vout (Q) are not synchronized with each other in the time domain. (d) is the DAC 411 output signal Vpk. It can be seen that the output signal Vpk of the DAC 411 is output in a portion in which the Vout(timing) signal and the Vout(Q) signal overlap each other in the time domain, and the size of Vout(Q) is detected. In particular, in the case of the communication noise area, it can be seen that, since Vout(timing) and magnitude pulse Vout(Q) are not synchronized with each other in the time domain, there is no output in this area, and it can be seen that noise is removed. (e) is the output RF signal Vout of the partial discharge signal generating unit 400. The partial discharge signal generating unit 400 receives signals from the ADCs 316, 317 and 318 and generates a Vpk signal (partial discharge pulse) through a DAC to produce RF to regenerate the partial discharge signal.

Figure 18:
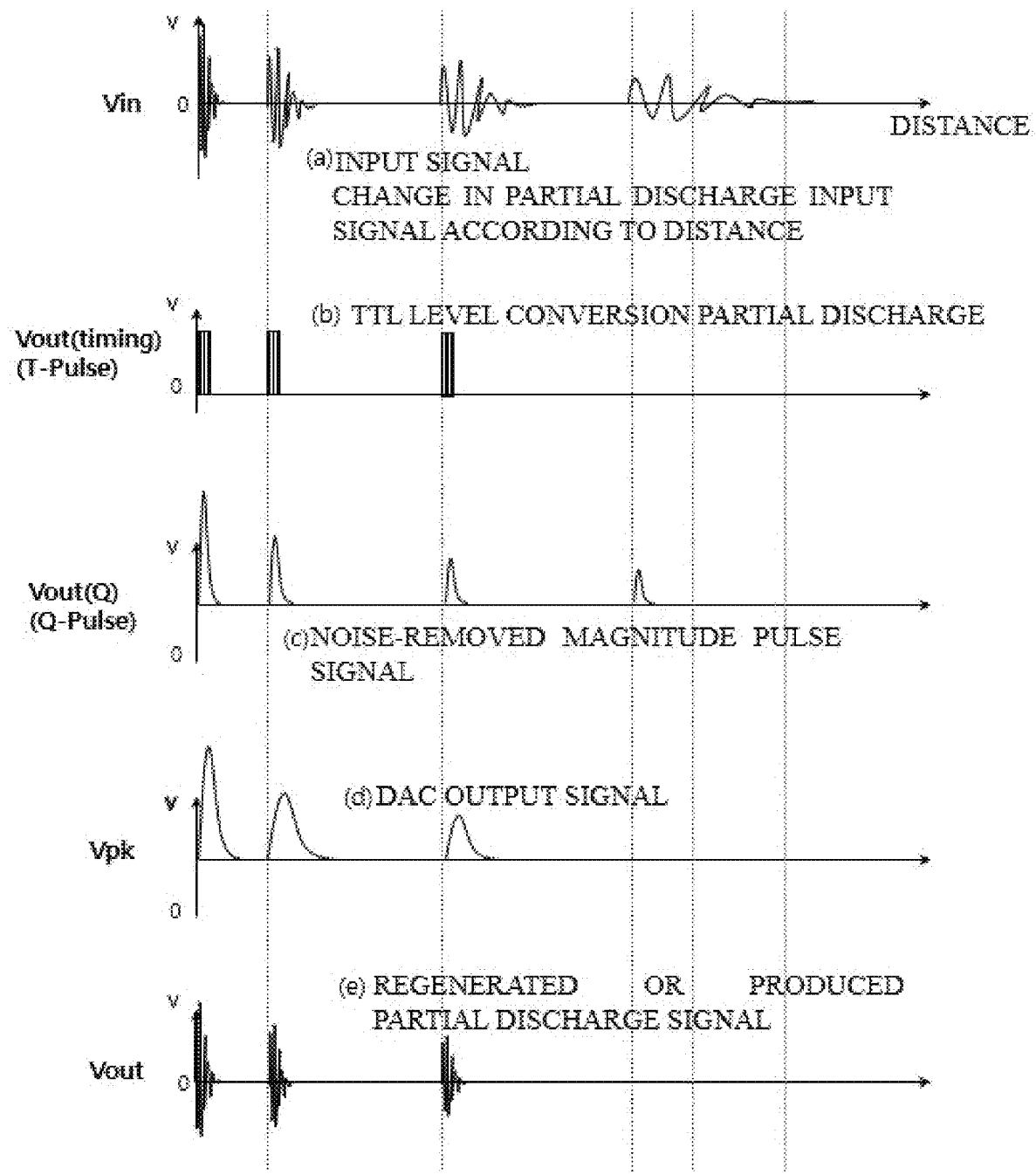
FIG. 18 is a view illustrating a process of converting a partial discharge signal into a noisy signal according to a travel distance of a broadband lossless partial discharge detection and noise removal device according to an embodiment of the present disclosure and an embodiment of partial discharge detection based on a constant distance relationship.

FIG. 18 is a view illustrating a process of converting a partial discharge signal into a noisy signal according to a travel distance of a broadband lossless partial discharge detection and noise removal device according to an embodiment of the present disclosure and an embodiment of partial discharge detection based on a constant distance relationship.

More specifically, FIG. 18 is a view illustrating voltage waveforms input or output in a partial discharge occurrence timing pulse generating process, noise removal process, partial discharge signal reproducing or producing process of a broadband lossless partial discharge detection and noise removal device according to an embodiment of the present disclosure, in particular, illustrating a process in which a partial discharge signal is converted into a noisy signal according to a traveling distance and an embodiment of partial discharge detection according to a constant distance relationship. That is, in the past, since detection was performed regardless of distance, it was impossible to control the distance relationship, but the broadband lossless partial discharge detection and noise removal device 1000 according to the present disclosure illustrates that the detection distance may be controlled. FIG. 18 shows a change of the partial discharge signal according to a distance from a source, and shows a signal processing process of the present disclosure, that is, a process of processing even the partial discharge signal as noise when a distance is greater than a certain distance.

In FIG. 18, broadband lossless partial discharge detection and noise removal device 1000 may receive an input signal Vin through an input port 1. (a) shows, for example, a case in which a changed partial discharge signal according to a distance is input to Vin. (b) is the output signal Vout (timing) of the partial discharge occurrence timing pulse acquiring unit 100. Referring to Vout (timing), it can be seen that the partial discharge occurrence timing pulse is generated at a certain short distance from a source and recognized as noise after a certain distance. In an embodiment, the controller 500 may control the variable amplifier/variable attenuator 160 by receiving feedback of the pulse count from the timing pulse generating unit 150 to adjust a timing pulse generation sensitivity to control a distance relationship. (c) is the output signal Vout(Q) of the partial discharge magnitude pulse acquiring unit 200. It can be seen that the magnitude pulse has little change in magnitude in the case of the partial discharge signal and is output in the form of a pulse. When moving away from the partial discharge source, the partial discharge occurrence timing pulse does not occur even if the partial discharge magnitude pulse is generated. In this case, it can be seen that the partial discharge occurrence timing pulse Vout(timing) and the partial discharge magnitude pulse Vout(Q) are not synchronized with each other in the time domain. (d) is the output signal Vpk of the DAC 411. The output signal Vpk of the synchronization comparing unit 300 is output in a portion in which the Vout(timing) signal and the Vout(Q) signal overlap each other in the time domain, and the magnitude of Vout(Q) may be detected. When the distance is far from the partial discharge source, there is no output in this area because Vout (timing) and magnitude pulse Vout (Q) are not synchronized in the time domain or there is no common area on the time axis, and accordingly, the partial discharge signal when the distance is far may be processed as noise and removed. (e) is the output signal Vout of the partial discharge signal generating unit 400. The partial discharge signal generating unit 400 may receive signals from the ADCs 316, 317, and 318 and generate a Vpk signal (partial discharge pulse) through a DAC to produce RF to regenerate the partial discharge signal.

Figure 19:
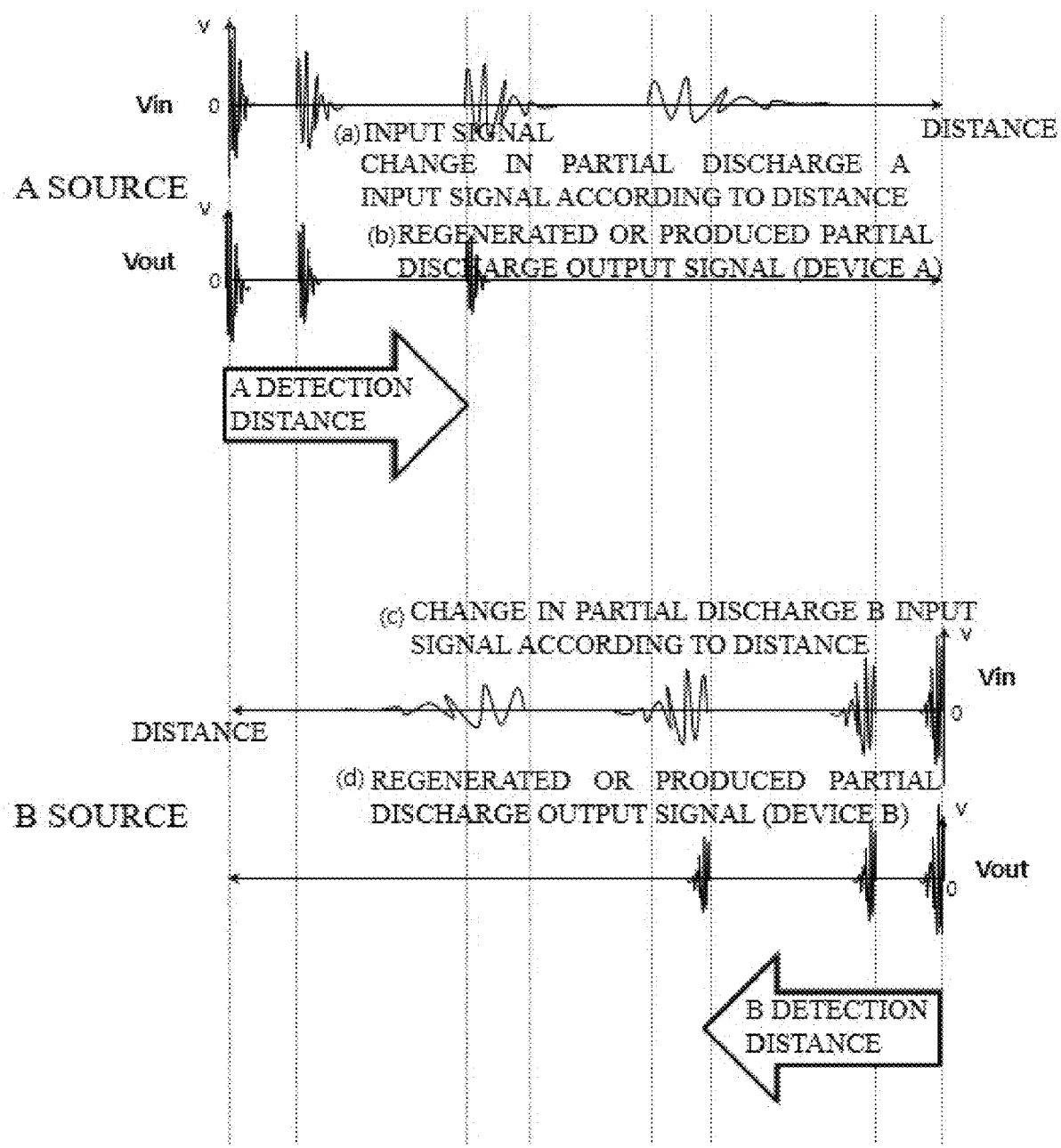
FIG. 19 is a view illustrating voltage waveforms input or output in a partial discharge occurrence timing pulse generating process, noise removal process, partial discharge signal reproducing or producing process of a broadband lossless partial discharge detection and noise removal device according to an embodiment of the present disclosure, which, in particular, illustrates a process in which a partial discharge signal is converted into a noisy signal according to a travel distance and an embodiment of partial discharge detection based on a constant distance relationship from different partial discharge sources.

FIG. 19 is a view illustrating voltage waveforms input or output in a partial discharge occurrence timing pulse generating process, noise removal process, partial discharge signal reproducing or producing process of a broadband lossless partial discharge detection and noise removal device according to an embodiment of the present disclosure, which, in particular, illustrates a process in which a partial discharge signal is converted into a noisy signal according to a travel distance and an embodiment of partial discharge detection based on a constant distance relationship from different partial discharge sources.

FIG. 19 shows an embodiment of partial discharge detection distance control by distance relationship control of the broadband lossless partial discharge detection and noise removal device 1000. In FIG. 19, two different partial discharge sources (A and B) are taken as examples, and it is shown that the detection distance between the two sources may be adjusted not to overlap. That is, FIG. 19 shows a process of processing even a partial discharge signal as noise when the distance between the broadband lossless partial discharge detection and noise removal device 1000 and the partial discharge source is more than a certain distance.

In FIG. 19, the broadband lossless partial discharge detection and noise removal device 1000 may receive an input signal Vin through an input port 1. (a) and (c) illustrate changes in the distance relationship of partial discharge signals generated from different sources and propagated in different directions. (b) and (d) show the acquisition and output of a modified signal for each distance relationship of the partial discharge signals generated from the two sources. The partial discharge signals of (a) and (c) are in overlapping ranges, but the partial discharge detection and output signals of (c) and (d) do not overlap. In an embodiment, the broadband lossless partial discharge detection and noise removal device 1000 may identify a direction and a distance for each source by performing distance relationship control.

Figure 20:
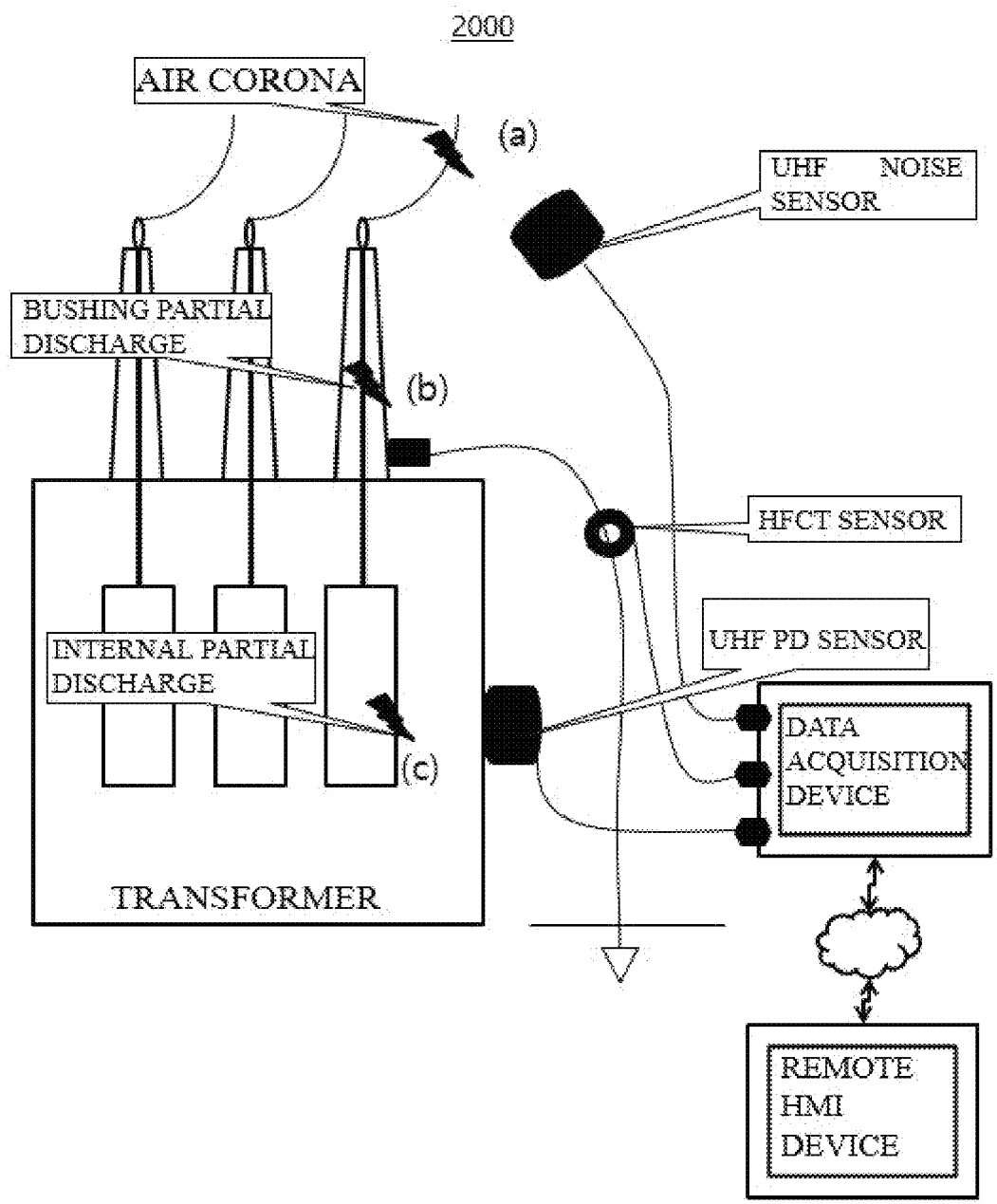
FIG. 20 is a view illustrating a method of removing air corona noise, a method or removing noise by comparison between channels, and remote monitoring, as a partial discharge detection distance control method based on distance relationship control of a broadband lossless partial discharge detection and noise removal system including a plurality of broadband lossless partial discharge detection and noise removal devices according to an embodiment of the present disclosure.

FIG. 20 is a view illustrating a method of removing air corona noise, a method or removing noise by comparison between channels, and remote monitoring, as a partial discharge detection distance control method based on distance relationship control of a broadband lossless partial discharge detection and noise removal system including a plurality of broadband lossless partial discharge detection and noise removal devices according to an embodiment of the present disclosure.

In FIG. 20, three different types of partial discharge sources (a, b, and c) are taken as examples, and different sensors (UHF noise sensor, HFCT sensor, and UHF PD sensor) are taken as examples, and a data acquiring device including at least one broadband lossless partial discharge detection and noise removal device 1000 and a remote human machine interface (HMI) device are shown as an embodiment.

In FIG. 20, a broadband lossless partial discharge detection and noise removal system 2000 includes a plurality of partial discharge sources that are located at a certain distance from each other and generate partial discharge signals mixed with noise, a plurality of partial discharge sensors disposed respectively in the plurality of partial discharge sources, and a data acquisition device separately acquiring a partial discharge signal from a partial discharge signal mixed with noise detected through the plurality of partial discharge sensors, wherein the data acquisition device includes the data acquisition device includes a plurality of broadband lossless partial discharge detection and noise removal devices including a partial discharge occurrence timing pulse acquiring unit acquiring a generated timing pulse of a partial discharge signal at the beginning of generation of a partial discharge signal, a partial discharge magnitude pulse acquiring unit acquiring a magnitude pulse of the partial discharge signal, a synchronization comparing unit detecting a partial discharge digital signal determined according to whether the generated timing pulse of the partial discharge signal and the magnitude pulse are synchronized, and a partial discharge signal generating unit detecting a partial discharge pulse obtained by converting the detected partial discharge digital signal into an analog signal. In an embodiment, whether the timing pulse and the magnitude pulse for a partial discharge signal of another partial discharge source detected from a specific partial discharge source, among the plurality of partial discharge sources, are synchronized with each other in a time domain may be determined, and the partial discharge signal of the other partial discharge source is removed as noise and only a partial discharge signal of the specific partial discharge source may be detected based on the synchronization through the plurality of broadband lossless partial discharge detection and noise removal devices. For example, the broadband lossless partial discharge detection and noise removal system 2000 may (a) acquire air corona with a UHF noise sensor, (b) acquire a bushing partial discharge signal with a HFCT sensor, and (c) acquire a transformer internal partial discharge signal by a UHF PD sensor to receive the input signal Vin. In an embodiment, the data acquisition device may communicate with the remote HMI device via the network communication module 5. (a) Air corona may propagate inside the transformer along a line and (c) may be mixed with the internal partial discharge signa to be acquired by the UHF PD sensor. In this case, when the variable amplifier/attenuator 160 is controlled with pulse count feedback through the controller 500 by applying the distance relationship control embodiment of FIG. 19, the air corona signal entered from the outside among the mixed signals is attenuated and turned into a noisy signal, the air corona signal is not detected because it does not generate a timing pulse, and only the internal partial discharge signal generated inside may be detected. In particular, in order to further remove the air corona when the attenuation of the air corona signal is not large, in an embodiment, when not only the internal partial discharge signal but also the air corona signal is detected in the UHF PD sensor of (c), the timing pulse of both signals may be detected, and at this time, only the internal partial discharge signal may be detected by (a) acquiring the air corona timing pulse generation with a UHF noise sensor and removing the common part of (a) in (c). In an embodiment, since the broadband lossless partial discharge detection and noise removal device 1000 has broadband characteristics without using a filter, a HFCT sensor having a bandwidth of 100 MHz or less and a UHF sensor having a bandwidth of 300 MHz to 2000 MHz may be simultaneously used, and therefore, three types of sensors (UHF noise sensor, HFCT sensor, and UHF PD sensor) may be used simultaneously. In an embodiment, a method of eliminating the effect of air corona or internal partial discharge in the bushing partial discharge and purely detecting only the bushing partial discharge signal is the same as the method of eliminating the air corona effect between (a)-(c). With the conventional technology, it was not possible to simultaneously measure HFCT (1 to 100 MHz) due to narrow band or band limitation (500 MHz to 1500 MHz), but with the use of the present disclosure, it is possible to measure all bands, so only the bushing partial discharge signal may be acquired by excluding the effect on other noise (air corona, internal partial discharge). The acquisition method is the distance relation method as described above, and a channel comparison method may be used to further improve performance.

Figure 21:
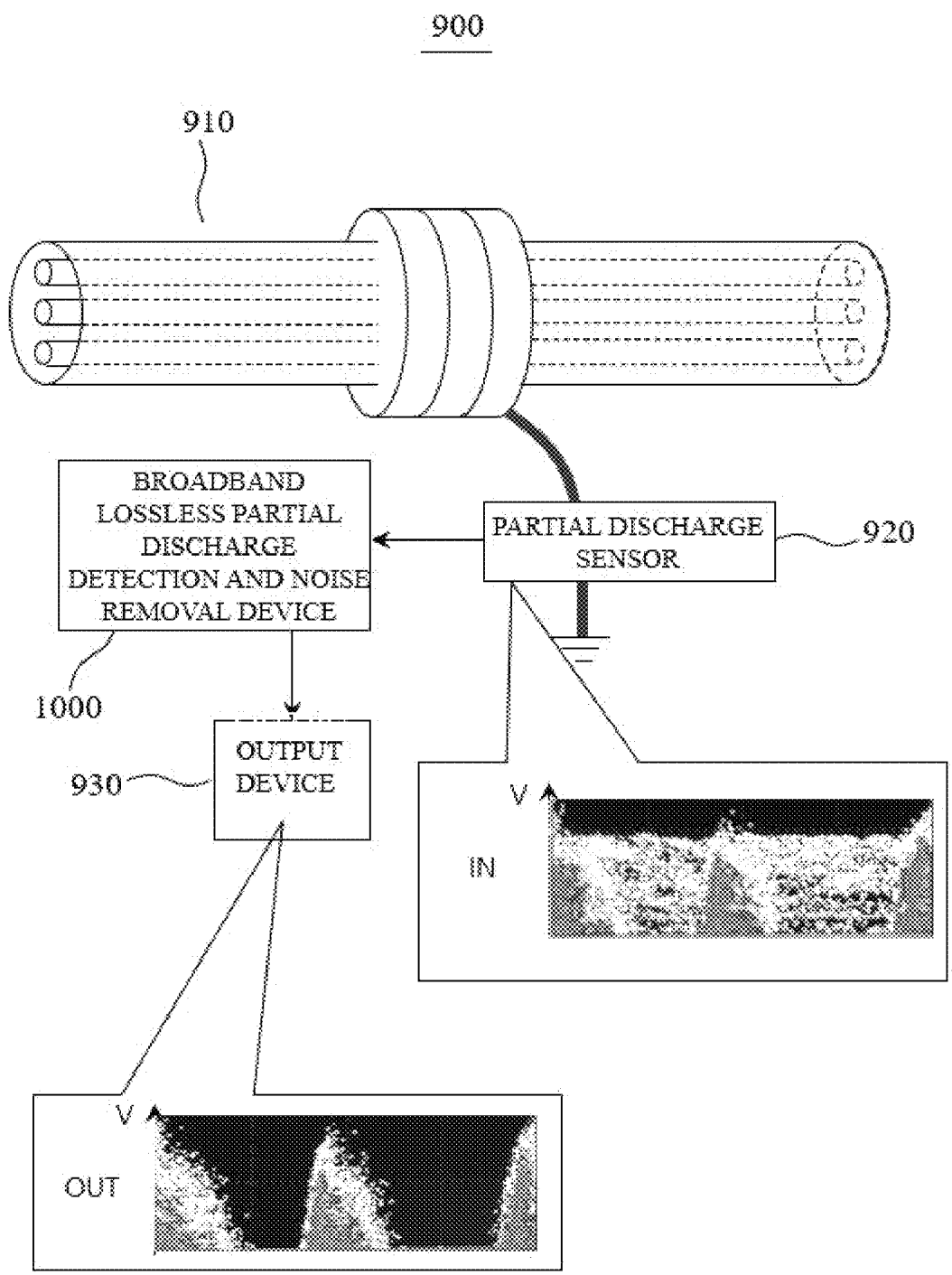
FIG. 21 is a view illustrating experimental results in which noise is removed and partial discharge is detected through a broadband lossless partial discharge detection and noise removal device according to an embodiment of the present disclosure.

FIG. 21 is a view illustrating experimental results in which noise is removed and partial discharge is detected through a broadband lossless partial discharge detection and noise removal device according to an embodiment of the present disclosure.

Referring to FIG. 21, a partial discharge detection system 900 may include an electric equipment 910, a partial discharge sensor 920, a broadband lossless partial discharge detection and noise removal device 1000, and an output device 930.

The electric equipment 910 may correspond to a power facility device that performs at least one of electricity generation, power generation, electricity conversion, electricity supply, and electricity control. For example, the electric equipment 910 may correspond to a cable partial discharge device including a solid insulation switchgear (SIS). In FIG. 8, the electric equipment 910 is shown in the form of a gas insulated switchgear, but may also correspond to a battery, an inverter, a power motor, a charger for an electric vehicle, a transformer, or a cable in an electric vehicle, high-speed train or building power distribution, ultra-high frequency (UHF)-related device.

The partial discharge sensor 920 may be coupled to a ground line of the electric equipment 910, and may be implemented as a current transformer (CT) that detects electromagnetic waves generated by the electric equipment 910 and converts the same into current, and the broadband lossless partial discharge detection and noise removal device 1000 may receive a current converted from the partial discharge sensor 920 as an input signal, generate a partial discharge timing signal based on the corresponding input signal, detect only the partial discharge signal, and resultantly perform partial discharge detection.

The output device 930 may be connected to the partial discharge occurrence timing pulse acquiring unit 100, process signals received from the broadband lossless partial discharge detection and noise removal device 1000, and visualize to phase resolved partial discharge (PRPD) or phase resolved pulse sequence (PRPS). In an embodiment, the output device 930 may be implemented through at least one of a digital conversion module capable of converting analog signals received from the partial discharge occurrence timing pulse acquiring unit 100 into digital signals, a field-programmable gate array (FPGA) implemented to be capable of program based on the converted digital signal, a personal computer (PC) board processing a signal received from the FPGA, and a display module visually outputting a processed signal.

Figure 22:
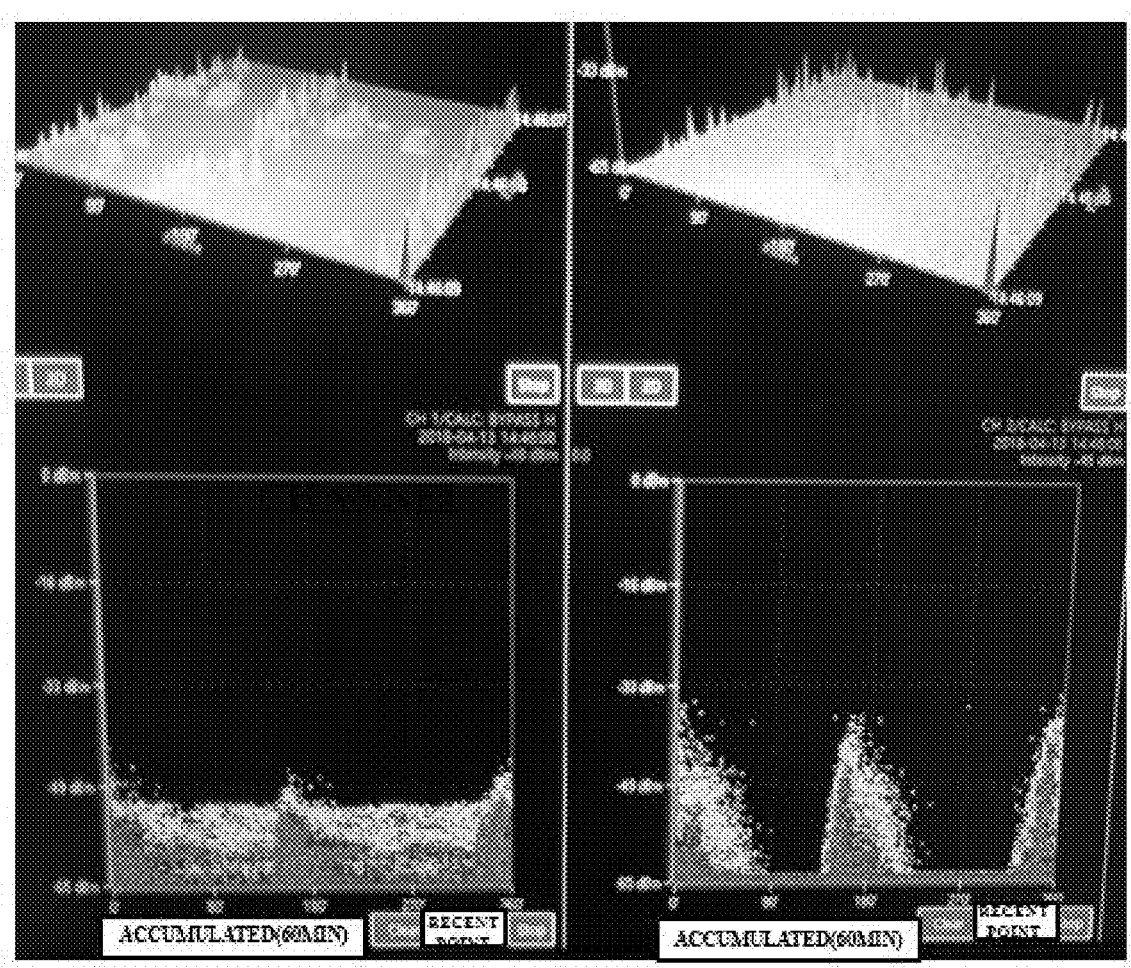
FIG. 22 is an output result graph illustrating comparison between results (channel B) of detecting whether partial discharge occurs by actually implementing a broadband lossless partial discharge detection and noise removal device according to an embodiment of the present disclosure and the conventional technology (channel A).

FIG. 22 is an output result graph illustrating comparison between results (channel B) of detecting whether partial discharge occurs by actually implementing a broadband lossless partial discharge detection and noise removal device according to an embodiment of the present disclosure and the conventional technology (channel A).

In FIG. 21, as described above, the broadband lossless partial discharge detection and noise removal device 1000 may be implemented as an actual device and receive a target signal as an input signal from the partial discharge sensor 920 connected to the electric equipment 910 of the SIS equipment, process the provided input signal to detect whether a partial discharge signal is included, and visualize the corresponding input/output signal through the output device 930.

In FIG. 22, the graph is a comparison graph in which channel A represents the input signal Vin provided from the partial discharge sensor 920 without passing through the device of the present disclosure, and channel B represents the input signal Vin provided from the partial discharge sensor 920 by passing through the device of the present disclosure. It can be seen that the partial discharge occurrence timing pulse acquiring unit 100 according to an embodiment of the present disclosure suppresses noise in the provided input signal Vin and detects whether or not the partial discharge signal is included with high accuracy.

Embodiments of the present disclosure have been described but those skilled in the art will appreciate that various modifications and variations may be made in the present disclosure without departing from the scope of the present disclosure.

The broadband lossless partial discharge detection and noise removal device according to the present disclosure may be used for preventive diagnosis of electric equipment in the fields of power facilities and electric vehicles.

What is claimed is:
1. A broadband lossless partial discharge detection and noise removal device comprising:
    a partial discharge occurrence timing pulse acquiring unit acquiring a generated timing pulse of a partial discharge signal at the beginning of generation of a partial discharge signal;
    a partial discharge magnitude pulse acquiring unit acquiring a magnitude pulse of the partial discharge signal;
    a synchronization comparing unit detecting a partial discharge digital signal determined according to whether the generated timing pulse of the partial discharge signal and the magnitude pulse are synchronized; and
    a partial discharge signal generating unit detecting a partial discharge pulse obtained by converting the detected partial discharge digital signal into an analog signal,
    wherein the synchronization comparing unit detects the corresponding pulse as the partial discharge pulse when the timing pulse and the magnitude pulse of the partial discharge signal are synchronized in the time domain, and determines and removes the corresponding pulse as noise when the timing pulse and the magnitude pulse are not synchronized, wherein the synchronization comparing unit variably determines whether the synchronization is performed according to a distance from the source of the partial discharge signal.

2. The broadband lossless partial discharge detection and noise removal device of claim 1, wherein the partial discharge signal generating unit regenerates or generates a partial discharge signal through the detected partial discharge pulse.

3. The broadband lossless partial discharge detection and noise removal device of claim 1, wherein the partial discharge occurrence timing pulse acquiring unit includes:

a first proportional signal generating unit generating first and second proportional signals according to an input signal;

a first AGC performing automatic gain control on a partial discharge detection signal generated based on the first proportional signal and fed back to an input terminal through at least one partial discharge capacitor;

a second AGC performing automatic gain control based on a partial discharge comparison signal generated based on the second proportional signal and fed back to the input terminal;

a timing noise removal unit generating a timing noise removal signal from which timing noise is removed based on the partial discharge detection signal and the partial discharge comparison signal; and a timing pulse generating unit acquiring a partial discharge occurrence timing pulse.

4. The broadband lossless partial discharge detection and noise removal device of claim 3, wherein the partial discharge magnitude pulse acquiring unit includes:

a second proportional signal generating unit generating third and fourth proportional signals according to an input signal;

a third AGC performing automatic gain control on a partial discharge detection signal generated based on the third proportional signal and fed back to the input terminal through at least one partial discharge capacitor;

a fourth AGC performing automatic gain control based on a partial discharge comparison signal generated based on the fourth proportional signal and fed back to the input terminal;

a magnitude noise removal unit generating a magnitude noise removal signal from which magnitude noise is removed based on the partial discharge detection signal and the partial discharge comparison signal; and a magnitude pulse generating unit acquiring a partial discharge magnitude pulse.

5. The broadband lossless partial discharge detection and noise removal device of claim 4, wherein the first AGC feeds back intensity of an amplitude or frequency of the partial discharge detection signal to the input terminal through the at least one partial discharge capacitor, and when the partial discharge signal is reflected in the partial discharge detection signal, the first AGC induces a temporary change in a VGC factor (voltage amplification or a slope characteristic of an output voltage), starting at the beginning of the partial discharge occurrence in the process of the automatic gain control.

6. The broadband lossless partial discharge detection and noise removal device of claim 4, wherein the first AGC filters a specific frequency band from the partial discharge detection signal through at least one partial discharge capacitor having one end connected to an output terminal and the other end connected to a ground, and feeds back to the corresponding automatic gain control process.

7. The broadband lossless partial discharge detection and noise removal device of claim 4, wherein the third AGC includes a partial discharge loop filter module performing adjustment of a frequency band width of the partial discharge detection signal input to the input terminal through the at least one partial discharge capacitor and at least one partial discharge resistor connected to one end of the at least one partial discharge capacitor.

8. The broadband lossless partial discharge detection and noise removal device of claim 6, wherein the first AGC performs the frequency bandwidth adjustment through a low pass filter (LPF) or a high pass filter (HPF) implemented through a combination of at least two of a capacitor, an inductor, a resistor, and an amplifier.

9. The broadband lossless partial discharge detection and noise removal device of claim 4, wherein the timing noise removal unit and the magnitude noise removal unit each remove a component other than the partial discharge as the timing noise and the magnitude noise by eliminating a difference portion between the partial discharge detection signal and the partial discharge comparison signal or summing similar portions.

10. The broadband lossless partial discharge detection and noise removal device of claim 7, wherein the timing noise removal unit and the magnitude noise removal unit are implemented through a difference amplifier calculating a difference between the partial discharge detection signal and the partial discharge comparison signal or a differential amplifier differentially amplifying between the partial discharge detection signal and the partial discharge comparison signal.

11. The broadband lossless partial discharge detection and noise removal device of claim 10, wherein the timing pulse generating unit generates a partial discharge occurrence timing pulse by modifying the partial discharge signal acquired from the difference amplifier or the differential amplifier into a transistor logic (TTL) pulse.

12. The broadband lossless partial discharge detection and noise removal device of claim 4, wherein each of the first proportional signal generating unit and the second proportional signal generating unit is implemented through at least one of a log detector demodulating a log value of the input signal, an amplifier, an envelope detector, and an integrator or through a combination of at least two thereof.

13. The broadband lossless partial discharge detection and noise removal device of claim 4, wherein each of the timing noise removal unit and the magnitude noise removal unit further includes a noise removal module removing a signal output with an intensity smaller than a specific reference voltage, among output signals, to further remove the timing noise and the magnitude noise.

14. The broadband lossless partial discharge detection and noise removal device of claim 13, wherein each of the timing noise removal unit and the magnitude noise removal unit determines the specific reference voltage through manual setting by a user or automatic setting through internal or remote feedback.

15. The broadband lossless partial discharge detection and noise removal device of claim 14, wherein each of the timing noise removal unit and the magnitude noise removal unit performs the manual setting based on a local analog voltage according to a variable resistance manually varied by a user locally, a remote analog voltage provided remotely, or a digital-to-analog converter (DAC) output based on remotely provided remote digital data transmission.

16. The broadband lossless partial discharge detection and noise removal device of claim 14, wherein the timing noise removal unit includes (a) a low-pass filter disposed at an output terminal and filtering the timing noise removal signal and (b) a feedback module detecting a lowest value, an average value, or a highest value of the filtered timing noise removal signal through analog-to-digital conversion and digital operation and automatically setting the specific reference voltage by feeding back until a corresponding detection value converges within a specific reference range.

17. The broadband lossless partial discharge detection and noise removal device of claim 4, further comprising:
 a controller controlling a distance relationship with a source of the partial discharge signal by adjusting generation sensitivity of the partial discharge occurrence timing pulse by controlling a variable amplifier or variable attenuator upon receiving a pulse count feedback from the timing pulse generating unit; and
 a network communication module communicating with human machine interface (HMI) locally or remotely.

18. The broadband lossless partial discharge detection and noise removal device of claim 1, wherein the synchronization comparing unit determines that the timing pulse and the magnitude pulse are not synchronized in the time domain when the distance is greater than a predetermined reference, and removes the partial discharge signal as noise.

19. The broadband lossless partial discharge detection and noise removal device of claim 1, wherein the partial discharge signal generating unit selectively uses first and second DACs that variably determine topology of each circuit configuration according to the digital-to-analog conversion speed.

20. The broadband lossless partial discharge detection and noise removal device of claim 19, wherein
 the second DAC further includes:
 a frequency voltage controlled RF generator;
 an RF level adjusting unit adjusting an RF signal generated by the RF generator;
 an RF amplifier amplifying the adjusted RF signal; and
 an output level adjusting unit generating a partial discharge signal by adjusting the generation of the RF burst by the amplification.

21. A broadband lossless partial discharge detection and noise removal device comprising:
 a partial discharge occurrence timing pulse acquiring unit acquiring a generated timing pulse of a partial discharge signal at the beginning of generation of a partial discharge signal;
 a partial discharge magnitude pulse acquiring unit acquiring a magnitude pulse of the partial discharge signal;
 a synchronization comparing unit detecting a partial discharge digital signal determined according to whether the generated timing pulse of the partial discharge signal and the magnitude pulse are synchronized; and
 a partial discharge signal generating unit detecting a partial discharge pulse obtained by converting the detected partial discharge digital signal into an analog signal,
 wherein the synchronization comparing unit detects the corresponding pulse as the partial discharge pulse when the timing pulse and the magnitude pulse of the partial discharge signal are synchronized in the time domain, and determines and removes the corresponding pulse as noise when the timing pulse and the magnitude pulse are not synchronized,
 wherein the synchronization comparing unit analog-to-digital converts the partial discharge magnitude pulse signal by using the partial discharge occurrence timing pulse as a trigger, and selectively uses a first, second, or third analog-to-digital converter (ADC) according to a speed of the analog-to-digital conversion.

22. The broadband lossless partial discharge detection and noise removal device of claim 21, wherein the first ADC acquires the partial discharge signal by directly sampling an input radio frequency (RF) signal from an RF level without undergoing a modulation process.

23. The broadband lossless partial discharge detection and noise removal device of claim 21, wherein the second ADC acquires the partial discharge signal by sampling, at a high speed, an amplified or attenuated signal received from a variable amplifying unit controlled by the synchronization comparing unit without undergoing a special modulation process.

24. The broadband lossless partial discharge detection and noise removal device of claim 21, wherein the third ADC acquires the partial discharge signal by sampling a peak hold value calculated through a peak hold method of amplifying or attenuating an input signal, modulating the corresponding signal by an RF log detection module, and storing a maximum value in a capacitor.

25. A broadband lossless partial discharge detection and noise removal system comprising:
 a plurality of partial discharge sources located to be spaced apart from each other by a predetermined distance and generating partial discharge signals mixed with noise;
 a plurality of partial discharge sensors respectively disposed in the plurality of partial discharge sources; and
 a data acquisition device separately acquiring a partial discharge signal by distinguishing the partial discharge signal from the partial discharge signals mixed with noise detected through the plurality of partial discharge sensors,
 wherein the data acquisition device includes a plurality of broadband lossless partial discharge detection and noise removal devices including a partial discharge occurrence timing pulse acquiring unit acquiring a generated timing pulse of a partial discharge signal at the beginning of generation of a partial discharge signal, a partial discharge magnitude pulse acquiring unit acquiring a magnitude pulse of the partial discharge signal, a synchronization comparing unit detecting a partial discharge digital signal determined according to whether the generated timing pulse of the partial discharge signal and the magnitude pulse are synchronized, and a partial discharge signal generating unit detecting a partial discharge pulse obtained by converting the detected partial discharge digital signal into an analog signal,
 wherein whether the timing pulse and the magnitude pulse for a partial discharge signal of another partial discharge source detected from a specific partial discharge source, among the plurality of partial discharge sources, are synchronized with each other in a time domain is determined, and the partial discharge signal of the other partial discharge source is removed as noise and only a partial discharge signal of the specific partial discharge source is detected based on the synchronization through the plurality of broadband lossless partial discharge detection and noise removal devices.

26. The broadband lossless partial discharge detection and noise removal system of claim 25, wherein the plurality of broadband lossless partial discharge detection and noise removal devices simultaneously use various types of a plurality of sensors having different bandwidths, without using a filter.

* * * * *